US009823625B2

(12) United States Patent
Abe et al.

(10) Patent No.: US 9,823,625 B2
(45) Date of Patent: Nov. 21, 2017

(54) ELECTRONIC DEVICE

(71) Applicant: CASIO COMPUTER CO., LTD., Shibuya-ku, Tokyo (JP)

(72) Inventors: Kazuaki Abe, Iruma (JP); Masakuni Iwanaga, Akishima (JP); Junro Yano, Hachioji (JP); Yuta Saito, Kokubunji (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 14/660,653

(22) Filed: Mar. 17, 2015

(65) Prior Publication Data

US 2015/0268639 A1 Sep. 24, 2015

(30) Foreign Application Priority Data

Mar. 18, 2014 (JP) ................. 2014-054388
Mar. 26, 2014 (JP) ................. 2014-063368

(51) Int. Cl.
| | | |
|---|---|---|
| *G04R 60/00* | (2013.01) | |
| *G04R 60/06* | (2013.01) | |
| *G04R 60/10* | (2013.01) | |
| *G04R 60/12* | (2013.01) | |
| *G04G 19/00* | (2006.01) | |

(Continued)

(52) U.S. Cl.
CPC ............. *G04G 19/00* (2013.01); *G04C 10/02* (2013.01); *G04R 20/04* (2013.01); *G04R 60/00* (2013.01); *G04R 60/06* (2013.01); *G04R 60/10* (2013.01); *G04R 60/12* (2013.01); *H01L 31/0465* (2014.12)

(58) Field of Classification Search
CPC ........ G04R 60/00; G04R 60/06; G04R 60/10; G04R 60/12; G04G 19/00; G04C 10/02
USPC ........................................... 368/205
See application file for complete search history.

(56) References Cited

U.S. PATENT DOCUMENTS 3,427,797 A     2/1969  Negoro et al.
3,786,624 A  *  1/1974  Uchiyama ............. G04C 10/02
                                                           136/244

(Continued)

FOREIGN PATENT DOCUMENTS

EP     2447791 A1    5/2012
JP    59090076 A     5/1984

(Continued)

OTHER PUBLICATIONS

Hosaka et al., English Translation of JP 2013040794, orginally published Feb. 28, 2013, whole document.*

(Continued)

*Primary Examiner* — Amy Cohen Johnson
*Assistant Examiner* — Daniel Wicklund
(74) *Attorney, Agent, or Firm* — Holtz, Holtz & Volek PC

(57) ABSTRACT

An electronic device includes a dial, a module and a solar panel. The module is arranged under the dial and including a circular polarization antenna which includes a power feed point and a radiating electrode. The solar panel is arranged between the dial and the module and has an area corresponding to an area of the dial in a face direction thereof. The solar panel is constituted by a plurality of solar cells including a solar cell that has a light receiving surface arranged at a position corresponding to the radiating electrode.

9 Claims, 9 Drawing Sheets

(51) Int. Cl.
*G04C 10/02* (2006.01)
*G04R 20/04* (2013.01)
*H01L 31/0465* (2014.01)

(56) References Cited

U.S. PATENT DOCUMENTS

| | | | | |
|---|---|---|---|---|
| 3,890,776 | A | * | 6/1975 | Urushida ............... G04C 3/008 136/244 |
| 4,038,104 | A | | 7/1977 | Tsutomu |
| 6,094,404 | A | * | 7/2000 | Hidai ..................... G04B 19/12 136/257 |
| 6,268,558 | B1 | | 7/2001 | Kubota |
| 6,372,977 | B1 | | 4/2002 | Miyoshi |
| 6,901,033 | B2 | | 5/2005 | Ito |
| 7,136,138 | B1 | | 11/2006 | Sekiguchi et al. |
| 7,746,731 | B2 | | 6/2010 | Murakami et al. |
| 8,493,817 | B2 | | 7/2013 | Baba |
| 9,030,362 | B2 | | 5/2015 | Abe |
| 2010/0097896 | A1 | * | 4/2010 | Baba ....................... G01S 19/14 368/47 |
| 2011/0051561 | A1 | * | 3/2011 | Fujisawa ................ G04G 5/002 368/47 |
| 2011/0187609 | A1 | | 8/2011 | Abe |
| 2012/0002511 | A1 | * | 1/2012 | Matsuzaki ............. G04G 21/04 368/10 |
| 2012/0002512 | A1 | * | 1/2012 | Matsuzaki ............. G04C 10/02 368/47 |
| 2012/0105288 | A1 | * | 5/2012 | Abe ........................ G04C 10/02 343/702 |
| 2013/0051192 | A1 | | 2/2013 | Oshio |
| 2014/0060614 | A1 | | 3/2014 | Saito |
| 2014/0247705 | A1 | | 9/2014 | Saito |
| 2015/0277389 | A1 | | 10/2015 | Saito et al. |

FOREIGN PATENT DOCUMENTS

| | | | |
|---|---|---|---|
| JP | 2010096707 A | | 4/2010 |
| JP | 2011163913 A | | 8/2011 |
| JP | 2012093288 A | | 5/2012 |
| JP | 2012198150 A | | 10/2012 |
| JP | 2012211895 A | | 11/2012 |
| JP | 2013040794 | * | 2/2013 |
| JP | 2016092255 A | | 5/2016 |

OTHER PUBLICATIONS

Non-Final Office Action dated Mar. 24, 2017 issued in related U.S. Appl. No. 15/056,414.

* cited by examiner

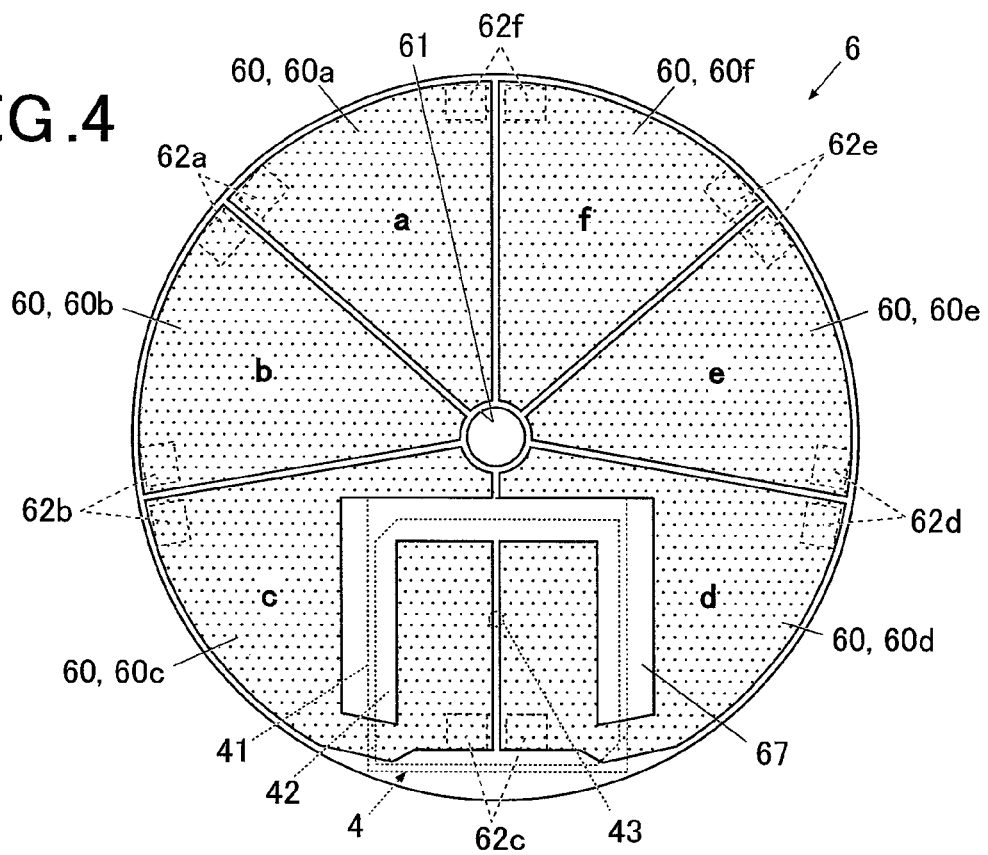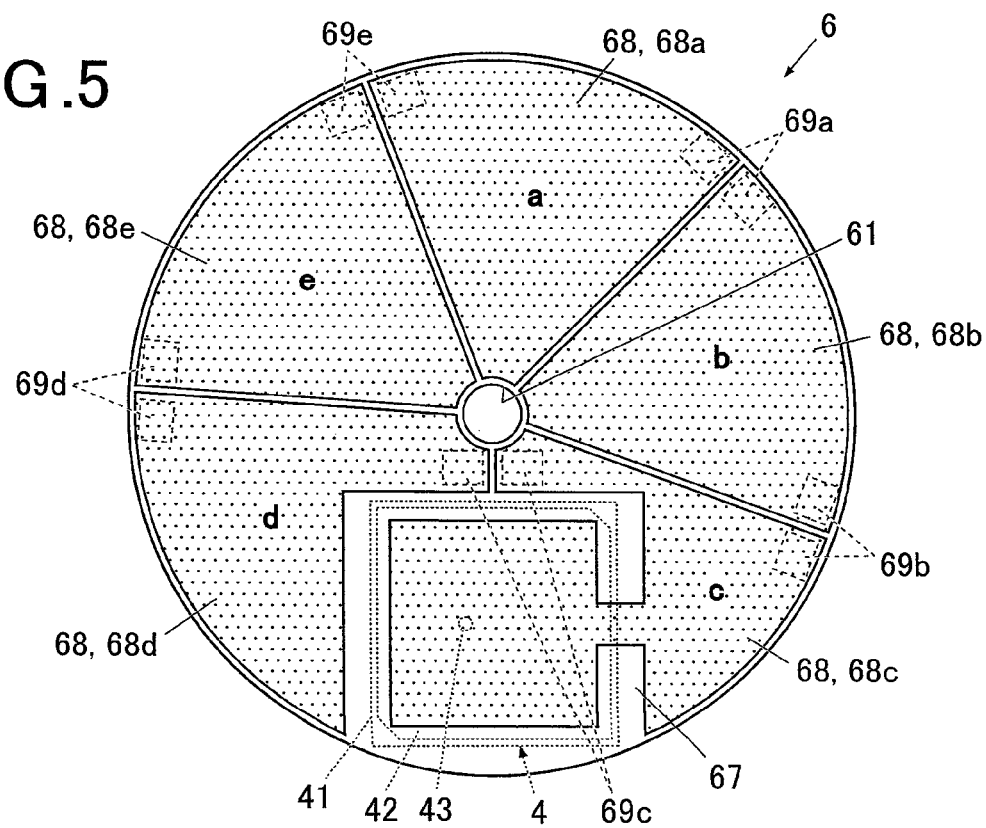

ELECTRONIC DEVICE

CROSS REFERENCE TO RELATED APPLICATION

This application is based upon and claims the benefit of priority under 35 USC 119 of Japanese Patent Applications No. 2014-054388 filed on Mar. 18, 2014 and No. 2014-063368 filed on Mar. 26, 2014, the entire disclosure of each of which, including the description, claims, drawings and abstract, is incorporated herein by reference in its entirety.

BACKGROUND OF THE INVENTION

1. Field of the Invention

The present invention relates to electronic devices and, more particularly, to electronic devices configured to correct time by receiving radio waves from a global positioning system (GPS).

2. Description of Related Art

Conventionally, a timepiece using the GPS has been developed (which will be referred to as a GPS timepiece hereinafter) as an electronic device capable of correcting time to provide exact time anywhere in the world.

For example, JP2010-96707 A, which is a Japanese patent document, discloses a timepiece, which is so-called a solar watch, including a solar panel as an electronic device to generate power by receiving light. The electronic device, such as the solar timepiece, can be used for a long time without replacing a battery by generating power with a solar panel to charge a secondary battery. The patent document above also discloses a structure to suppress deterioration of antenna characteristics of an antenna by forming a notch at a part of the solar panel corresponding to the antenna so as not to place the solar panel above the antenna.

If, however, such a notch is provided in the solar panel corresponding to the antenna as disclosed in the patent document above, a light receiving area of the solar panel is correspondingly decreased, which causes a decrease in power generation amount.

Further, a notch in the solar panel may easily be seen through from the dial side, which damages design property.

The present invention has been achieved in view of the above problems, and an object of the present invention is to provide an electronic device that can prevent deterioration of antenna characteristics of a circular polarization antenna that receives GPS radio waves, while having excellent design property and capable of minimizing the decrease of power generation amount of the solar panel.

SUMMARY OF THE INVENTION

In order to realize the above object, according to a first aspect of the present invention, there is provided an electronic device including:
a dial;
a module arranged under the dial and including a circular polarization antenna which includes a power feed point and a radiating electrode; and
a solar panel arranged between the dial and the module and has an area corresponding to an area of the dial in a face direction thereof, wherein
the solar panel is constituted by a plurality of solar cells including a solar cell that has a light receiving surface arranged at a position corresponding to the radiating electrode.

BRIEF DESCRIPTION OF THE DRAWINGS

The present invention will become more fully understood from the detailed description given hereinbelow and the appended drawings which are given by way of illustration only, and thus are not intended as a definition of the limits of the present invention, and wherein:

FIG. 4 is a plan view of a solar panel of the second embodiment;

FIG. 5 is a plan view of a modification of the solar panel in FIG. 4;

DETAILED DESCRIPTION OF THE PREFERRED EMBODIMENT

First Embodiment

A first embodiment of an electronic device of the present invention will be described by referring to FIGS. 1 to 3.

In the embodiments described below, various limitations that are considered to be technically preferable to implement the present invention have been provided, but those limitations are not intended to limit the scope of the present invention to the embodiments below and accompanying illustrated examples.

In the present embodiment, the electronic device will be described when it is realized as an analogue type timepiece that displays time, etc. by movement of hands.

Figure 1:
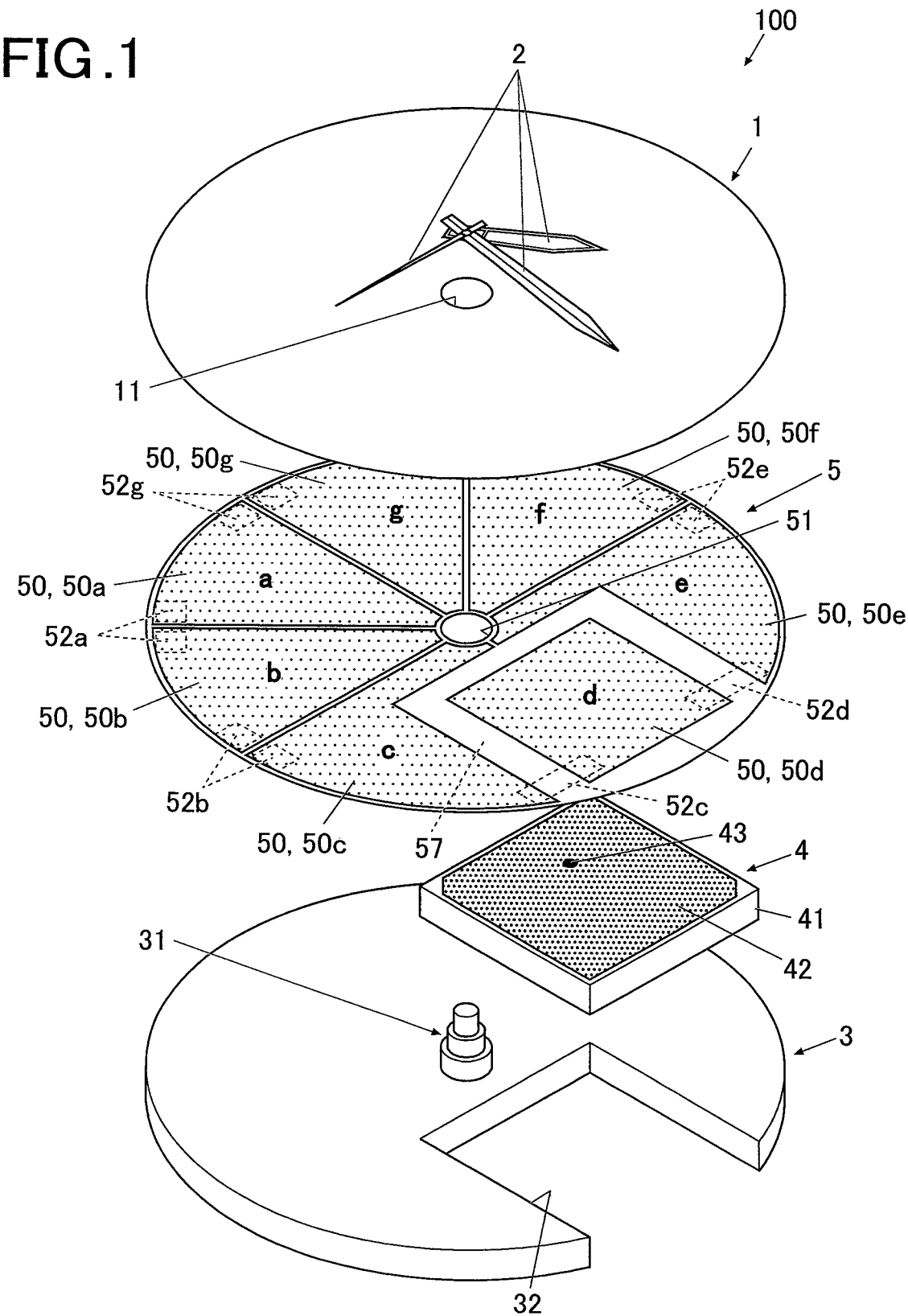
FIG. 1 is an exploded perspective view of a timepiece of the first embodiment.

FIG. 1 is an exploded perspective view of a timepiece of the present embodiment.

As illustrated in FIG. 1, a timepiece 100 of the present embodiment includes a dial 1, a module 3 including a circular polarization antenna 4, and a solar panel 5.

The timepiece 100 also includes a secondary battery (not illustrated) to which power generated by the solar panel 5 is charged to form a power source unit of the timepiece 100.

The dial 1, the module 3, and the circular polarization antenna 4, the solar panel 5, and the secondary battery are stored in a case which is not illustrated. The case is made of a metallic material, such as steel special use stainless (SUS), titanium, etc. The materials of the case are not limited to those illustrated herein. For example, any material other than metals, such as resin, may be used.

In the present embodiment, the dial 1 is arranged on the viewing side of the timepiece 100 as an analogue type dial that displays time by pointers 2 including an hour hand and a minute hand.

A through hole 11 is formed in nearly the center of the dial 1. A pointer shaft 31, to which the pointers 2 are mounted, is inserted in the through hole 11.

The timepiece 100 of the present embodiment includes a circular polarization antenna 4 that receives GPS waves made of microwaves which will be described later. Preferably, therefore, the dial 1 is made of a non-metallic material, such as resin or glass, through which microwaves can transmit.

The timepiece 100 also includes the solar panel 5 that receives light to generate power. Therefore, the dial 1 is made of a transparent or a semi-transparent material having a light transmission characteristic.

The dial 1 may also be formed by vapor deposition of a metal film on the surface of a base material made of, for example, a transparent or semi-transparent resin or glass, such that the metal film has a thickness so as not to attenuate the microwave nor prevent transmission of light. Alternatively, the dial 1 may be formed by performing various types of printing on the surface of the base material.

The module 3 is arranged under the dial 1 (that is, on the back side of the timepiece 100), and includes, for example, a timepiece movement formed by a wheel train mechanism, a motor, etc. to move the pointers 2, a communication module connected to the circular polarization antenna 4, and a circuit board having various electronic components, such as a control circuit to display time by the pointers 2 mounted on the circuit board (none of which are illustrated). The module 3 is stored in a housing (not illustrated) made of resin or the like.

The control circuit provided in the timepiece 100 of the present embodiment has a function to correct internal time of the timepiece 100 by using time information or the like included in the GPS radio waves to provide exact time.

In the present embodiment, a pointer shaft 31 is provided in nearly the center of the module 3 to protrude upward from the movement side.

The pointer shaft 31 is inserted into a through hole 51 and a through hole 11 of the solar panel 5 and the dial 1, respectively, which will be described later, and sticks out of the dial 1.

The pointer shaft 31 is formed by a plurality of rotation shafts of, for example, hour, minute, and second hands placed on top of each other on the same axis. The pointers 2 (e.g., hour, minute, and second hands) are connected to individual rotation shafts of the pointer shaft 31.

When the movement is operated to rotate the pointer shaft 31, the pointers 2 mounted on the individual rotation shafts of the pointer shaft 31 rotate independently on the top face of the dial 1 about the pointer shaft 31.

The number of the pointers 2, for example, mounted on and moved about the pointer shaft 31 is not limited to the illustrated examples. For example, one pointer 2 may be enough, or a functional pointer that displays regarding various functions may be provided other than the hour, minute, and second hands.

At one end portion of the module 3 along the outer periphery thereof, an antenna fitting portion 32 where the circular polarization antenna 4 is fitted is formed.

The antenna fitting portion 32 is a notch or a recess along the outer shape of the circular polarization antenna 4.

Preferably, the top face of the module 3 is in the same plane with the top face of the circular polarization antenna 4 in a state where the circular polarization antenna 4 is fitted in the antenna fitting portion 32.

The circular polarization antenna 4 can receive GPS radio waves provided as circularly polarized microwaves (that is, the radio waves that contain time information, etc. transmitted from GPS satellites). A patch antenna, for example, is preferably used.

The GPS radio waves include data consisting of time information from highly precise atomic timepieces mounted on the GPS satellites, almanac data (or orbital information) of outline precision of all satellites, which is updated about every six days, and ephemeris data of satellites themselves, which is updated about every ninety minutes. The data are transmitted from each GPS satellite to the ground by the radio waves (microwaves) in the frequency band of L1 (1575.42 MHz) or L2 (1227.60 MHz).

The timepiece 100 receives the GPS wave from at least one of the plurality of GPS satellites through the circular polarization antenna 4, and uses the time information, etc. included therein to perform time correction of internal time of the timepiece 100 to provide exact time.

The GPS radio waves also include orbital information that indicates positions of the GPS satellites on the orbit as mentioned above. The timepiece 100, therefore, may also receive the GPS radio waves that have been transmitted from the plurality of GPS satellites through the circular polarization antenna 4 to execute positioning calculations using the time information and the orbital information included in the GPS radio waves.

As illustrated in FIG. 1, the circular polarization antenna 4 of the present embodiment is formed in the shape of a rectangle in a planar view, and includes a base 41 with a radiating electrode 42 (radiating element) arranged thereon. The shape of the circular polarization antenna 4 is not limited to the illustrated example.

The base 41 is made of a dielectric material, such as ceramics.

The radiating electrode 42 is made of a material, such as silver foil, a metal plate, or a metal film having a predetermined thickness.

Size (e.g., length of each side) of the radiating electrode 42 is optimized according to the frequency, etc. of the radio waves that the circular polarization antenna 4 should receive. In the present embodiment, it has been adjusted such that the highest antenna characteristic can be obtained in the frequency band of the GPS radio waves.

A power feed point 43 that feeds power to the radiating electrode 42 is provided at a position of the circular polarization antenna 4 having a circular polarization characteristic, that is, a position where impedance can be matched.

The system of feeding power to the radiating electrode 42 is not limited to a particular system.

Alternatively, a through hole (not illustrated) may be formed in a position corresponding to the power feed point 43 so as to penetrate the circular polarization antenna 4 in a thickness direction thereof, to thereby insert a power feeding member (e.g., a power feeding pin, coaxial cables, etc.) (not illustrated) in the through hole to feed power to the radiating electrode 42.

As described above, the circular polarization antenna 4 of the present embodiment is fitted in the antenna fitting portion 32 formed in the module 3.

Figure 2:
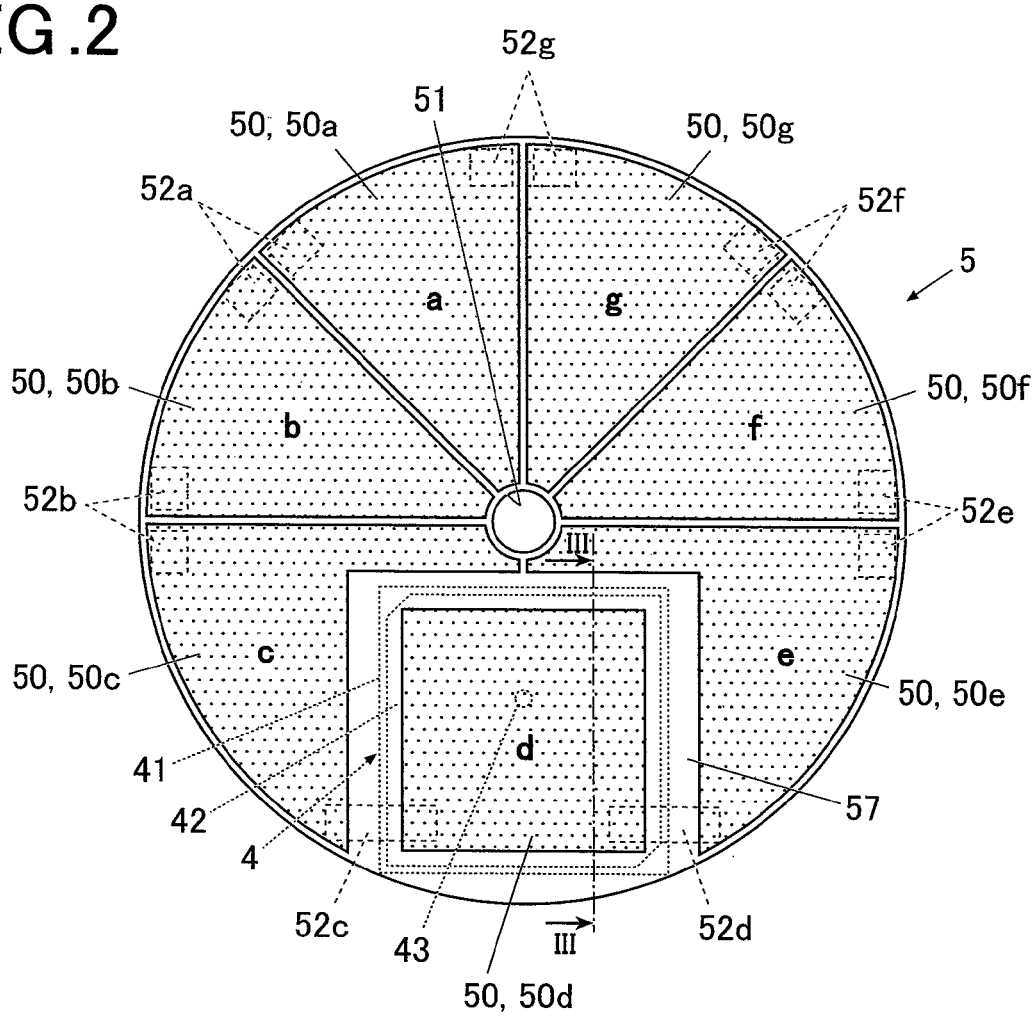
FIG. 2 is a plan view of a solar panel of the first embodiment.

In a state where the circular polarization antenna 4 is fitted in the antenna fitting portion 32, the circular polarization antenna 4 is placed at a position away from the pointer shaft 31 (see FIG. 2). The position or the direction of the circular polarization antenna 4 is not limited to the illustrated example.

The circular polarization antenna 4 is configured to spread the radiating pattern from end portions (peripheral portions) of the radiating electrode 42.

In the present embodiment, the radiating electrode 42 is formed in nearly a square, and the radiating pattern spreading from each side (peripheral portion) largely affects antenna characteristics (antenna radio wave reception performance) of the circular polarization antenna 4.

It is, therefore, important not to block the spreading of the radiating pattern from each side of the radiating electrode 42 to improve the antenna characteristics of the circular polarization antenna 4.

The solar panel 5 generates power by receiving light, and the power generated by the solar panel 5 is charged in the secondary battery.

The solar panel 5 of the present embodiment is arranged between the dial 1 and the module 3, and has an area corresponding to the area of the dial 1 in a face direction thereof.

The dial 1 of the present embodiment is made of a material having the light transmission characteristic as mentioned above, and a maximally large area of the solar panel 5 can be secured by making it correspond to the area of the dial 1 in the face direction.

The shape and the like of the solar panel 5 are not particularly limited. It is sufficient that the solar panel 5 has mostly the same area as the area of the dial 1 in the plane direction and substantially overlaps the dial 1. The area and shape of the solar panel 5 may not exactly match those of the dial 1.

Figure 3:
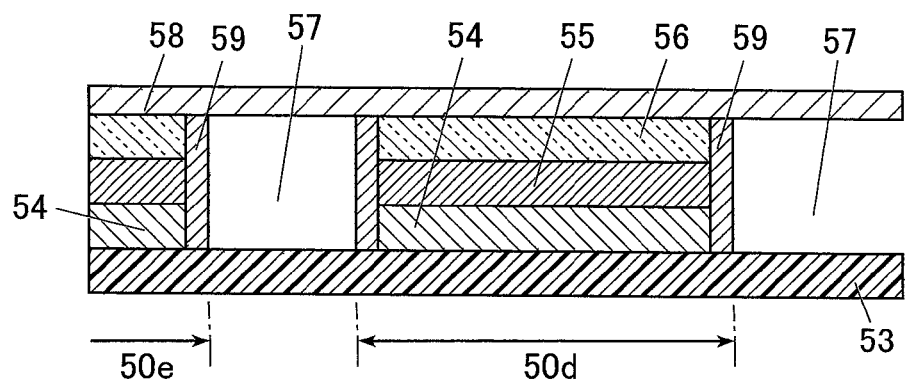
FIG. 3 is a sectional view of the solar panel along line III-III of FIG. 2.

FIG. 2 is a plan view of the solar panel 5 of the present embodiment, and FIG. 3 is a sectional view of the solar panel 5 along line III-III of FIG. 2.

As illustrated in FIGS. 1 and 2, the through hole 51 is formed in nearly the center of the solar panel 5 to which the pointer shaft 31 is inserted.

In the present embodiment, the solar panel 5 is constituted by a plurality of solar cells 50 (seven solar cells 50a to 50g in the present embodiment) including a solar cell 50 (indicated as solar cell 50d in the present embodiment) that has a light receiving surface arranged at a position corresponding to the radiating electrode 42 of the circular polarization antenna 4.

The term "light receiving surface" as used herein refers to a surface of the solar cell 50 capable of receiving light and generating power.

The "position corresponding to the radiating electrode 42" refers to a position above and substantially overlapping the radiating electrode 42.

Since the circular polarization antenna 4 is configured to spread a radiating pattern from the end portions (peripheral portions) of the radiating electrode 42 as mentioned above, the end portions of the radiating electrode 42 covered by a member that blocks transmission of the radio waves would deteriorate the antenna characteristics (radio wave reception performance) of the circular polarization antenna 4.

In the present embodiment, therefore, the solar cell 50d arranged at the position above the radiating electrode 42 is formed in such a manner that the light receiving surface thereof exactly overlaps or is smaller than the radiating electrode 42. Accordingly, the solar cell 50d does not stick out of the end portions of the radiating electrode 42, nor cover the end portions of the radiating electrode 42.

For example, if the radiating electrode 42 of the circular polarization antenna 4 is square with each side being 11.5 mm, it would be sufficient to form the light receiving surface of the solar cell 50d to have the size small enough to fit about 1 mm inside of the radiating electrode 42 to prevent deterioration of the antenna characteristics of the circular polarization antenna 4.

Although the light receiving surface of the solar cell 50d arranged at the position corresponding to the radiating electrode 42 is preferably arranged to fit within the end portions of the radiating electrode 42, the light receiving surface may be large enough to substantially overlap the radiating electrode 42 depending on a distance between the solar cell 50d and the top face of the radiating electrode 42. In this case, the light receiving surface still does not completely cover the end portions of the radiating electrode 42, and the antenna characteristics of the circular polarization antenna 4 can be maintained.

The solar panel 5 is formed, as illustrated in FIG. 3, in a stacked structure including a metal electrode 54 formed on a resin substrate 53, followed by a semiconductor layer 55, a transparent electrode 56, and a protective layer (protective film) 58 stacked on top of one another in this order. In addition, an insulating layer 59 is arranged on the sides of the stacked structure.

The resin substrate 53 is a flexible film type substrate. A material of the resin substrate 53 is not limited to any particular material, and plastic or the like, for example, may be used.

The metal electrode 54 is formed to include a metallic material such as an aluminum conductor. A material of the metal electrode 54 is not limited thereto.

The semiconductor layer 55 is made of, for example, amorphous silicon (a-Si:H). As the semiconductor layer 55, for example, a p-n junction type semiconductor in which p-type and n-type semiconductors are joined is used.

The metal electrode 54 and the semiconductor layer 55 are formed on the resin substrate 53 in a stacked manner by a method such as vapor deposition. The method of forming the metal electrode 54 and the semiconductor layer 55 on the resin substrate 53 is not limited thereto.

The transparent electrode 56 is formed by crystallization of zinc oxide, indium oxide, or tin oxide on a substrate made of glass or the like. The material and method of forming the transparent electrode 56 are not limited thereto.

In the present embodiment, a portion of the solar panel 5 around the solar cell 50d having the light receiving surface arranged at the position corresponding to the radiating electrode 42 is subjected to removal of the metal electrode 54, the semiconductor layer 55, and the transparent electrode 56, to thereby provide an electrode removed portion 57 around the solar cell 50d.

The method of removing the metal electrode 54, the semiconductor layer 55, and the transparent electrode 56 is not limited to any particular method, and a laser processing method, for example, may be used.

The electrode removed portion 57 of the present embodiment is provided to fit an outer shape of the radiating electrode 42 to have a width of about 1 mm inside and about 2 mm outside of the end portions across the positions corresponding to the end portions of the radiating electrode 42 (i.e., sides that constitute the outer shape of the radiating electrode 42).

The width, shape, and the like of the electrode removed portion 57 are not limited to those illustrated herein, and may be set as needed.

In terms of maintaining the antenna characteristics of the circular polarization antenna 4, it may be preferable to provide the electrode removed portion 57 in the entire range considered to affect the spreading of the radiating pattern from the end portions of the radiating electrode 42. However, an excessively large electrode removed portion 57 may decrease the light receiving area of the solar panel 5 to impair power generation efficiency. It is preferable, therefore, to provide the electrode removed portion 57 with the smallest possible width within a range not to impair the antenna characteristics of the circular polarization antenna 4.

In the present embodiment, the seven solar cells 50a to 50g are formed to have areas nearly equal to one another so as to output almost the same electric current.

The solar cells 50a to 50g (light receiving surfaces of the solar cells 50a to 50g) are connected in series to function as a solar panel.

Specifically, the solar cell 50a is electrically connected to the adjacent solar cell 50b at a connecting portion 52a, and the solar cell 50b is electrically connected to the adjacent solar cell 50c at a connecting portion 52b. The solar cell 50e is electrically connected to the adjacent solar cell 50f at a connecting portion 52e, and the solar cell 50f is electrically connected to the adjacent solar cell 50g at a connecting portion 52f.

The solar cell 50d having the light receiving surface arranged at a position corresponding to the radiating electrode 42 is electrically connected to the adjacent solar cell 50c at a connecting portion 52c, and is also electrically connected to the adjacent solar cell 50e at a connecting portion 52d.

For example, the connecting portion 52g formed on the side of the solar cell 50a is independent of the connecting portion 52g formed on the side of the solar cell 50g. A connector (connecting member) (not illustrated) is connected to each of the connecting portions 52g, 52g. The connectors are then connected to positive and negative electrodes, respectively, on a circuit board (not illustrated) to electrically connect the solar panel 5 to the circuit board. The connecting portions to be connected to the circuit board are not limited to the connecting portions 52g, 52g, and any connecting portions may be used so long as they have such structures.

The positions and shapes of the connecting portions 52a to 52g are not limited to the illustrated examples.

Since a metallic material is included in the connecting portions 52c, 52d that connect between the light receiving surface of the solar cell 50d and the light receiving surfaces of other solar cells 50c, 50e, the connecting portions 52c, 52d may correspondingly affect the antenna characteristics of the circular polarization antenna 4 when they are arranged across the end portions of the radiating electrode 42.

Preferably, therefore, the connecting portions 52c, 52d may have the smallest possible areas to minimize the influence on the antenna characteristics of the circular polarization antenna 4.

It is also preferable that the connecting positions between the solar cell 50d, which has the light receiving surface arranged at the position corresponding to the radiating electrode 42, and other solar cells 50c, 50e may be provided at positions apart from the power feed point 43 as far as possible.

If the case that stores the module 3, the solar panel 5, etc. is made of a metallic material to surround the circular polarization antenna 4, the antenna characteristics thereof would deteriorate. To prevent deterioration of the antenna characteristics, the power feed point 43 of the circular polarization antenna 4 is preferably located apart from the metal case as far as possible. As illustrated, for example, in FIG. 2, the power feed point 43 is located at a position closer to the pointer shaft 31.

Meanwhile, the connection between the light receiving surface (light receiving surface of the solar cell 50d in the present embodiment) arranged at a position corresponding to the radiating electrode 42 and other light receiving surfaces (light receiving surfaces of the solar cells 50c, 50e in the present embodiment) should preferably be apart from the power feed point 43 of the circular polarization antenna 4 as far as possible. When the power feed point 43 is provided at a position closer to the pointer shaft 31, the solar cell 50d is connected to other solar cells 50c, 50e at positions apart from the power feed point 43.

If the case is made of a material other than the metallic material (e.g., resin or the like), the position to form the power feed point 43 is not particularly limited, but it would still be preferable to separate the connection position of the solar cell 50 from the power feed point 43.

Next, operation of the timepiece 100 of the present embodiment will be described.

To assemble the timepiece 100 of the present embodiment, the solar panel 5 constituted by a plurality of solar cells 50 is formed first. Among the plurality of solar cells 50, the solar cell 50d arranged at the position corresponding to the radiating electrode 42 is subjected to removal of the metal electrode 54, the semiconductor layer 55, and the transparent electrode 56 from around the solar cell 50d, to thereby form the electrode removed portion 57.

The light receiving surfaces of the solar cells 50a to 50g are connected in series at the connecting portions 52a to 52g, respectively. Simultaneously, some of the connecting portions 52a to 52g (e.g., the connecting portion 52g provided on the side of the solar cell 50a and the connecting portion 52g provided on the side of the solar cell 50g) are connected to connectors (connecting members) which is not illustrated, and these connectors are coupled with the positive and negative electrodes, respectively, on the circuit board which is not illustrated. Accordingly, the solar panel 5 is electrically connected to the circuit board, and the power generated in the solar panel 5 becomes capable of being charged in the secondary battery.

The circular polarization antenna 4 is fitted in the antenna fitting portion 32 of the module 3, and the solar panel 5 is arranged on the module 3 in such a manner that the solar cell 50d is located over the circular polarization antenna 4. The dial 1 is then stacked on the solar panel 5 and stored in the case.

The pointers 2 are mounted on the pointer shaft 31 that penetrates the solar panel 5 and the dial 1 from the side of the module 3 and sticks out of the top face of the dial 1. After that, a windshield member (not illustrated) made of a transparent glass or the like is mounted on the side of the top face (viewing side) of the case over the dial 1. The assembly of the timepiece 100 is thus completed.

In the timepiece 100 of the present embodiment, light transmits through the windshield member and the dial 1 from the viewing side and is incident on the solar panel 5 including the solar cells 50a to 50g. Then the light passes through the transparent electrode 56 to enter the semiconductor layer 55. When the light enters the semiconductor layer 55, holes and electrons are generated in the vicinity of the junction between the p-type semiconductor and the n-type semiconductor. The generated electrons and holes are moved toward the n-type semiconductor and the p-type semiconductor, respectively, to generate electromotive force (photovoltaic power). As a result, electric current is made to flow through the circuit connected to the transparent electrode 56 and the metal electrode 54. The power generated by the solar panel 5 is thus charged in the secondary battery.

Meanwhile, in the timepiece 100, the GPS radio wave having transmitted through the windshield member and the dial 1 is incident on the circular polarization antenna 4.

Since the end portions of the radiating electrode 42 of the circular polarization antenna 4 are not covered by conductive members (e.g., the metal electrode 54, the semiconductor layer 55, and the transparent electrode 56 of the solar panel 5), as described above, the spreading of the radiating pattern is not blocked and the circular polarization antenna 4 can properly receive the GPS radio wave.

The GPS radio wave received by the circular polarization antenna 4 is sent to a control circuit (not illustrated) in the module 3. The control circuit uses time information, etc., included in the GPS radio wave to correct internal time of the timepiece 100 to provide exact time.

According to the present embodiment, as described above, the module 3 includes the circular polarization antenna 4 including the power feed point 43 and the radiating electrode 42, and the solar panel 5 having the area corresponding to the area of the dial 1 in the face direction thereof is arranged between the dial 1 and the module 3.

Accordingly, the circular polarization antenna 4 can receive the GPS radio wave and obtain precise time information to appropriately correct time, while various parts of the timepiece 100 is operated by the power generated in the solar panel 5. This can save time for a user to adjust time or replace battery of the timepiece 100 by a user.

The solar panel 5 is constituted by the plurality of solar cells 50 including the solar cell 50d that has the light receiving surface arranged at the position corresponding to the radiating electrode 42 of the circular polarization antenna 4.

Since the light receiving area of the solar panel 5 (i.e., area of effective region that can be used for photovolatic power generation) can be secured, the power generation efficiency can be improved.

Although the solar cell 50d is arranged above the radiating electrode 42 of the circular polarization antenna 4, the area thereof corresponds to the radiating electrode 42 (i.e., nearly equal to or smaller than the radiating electrode 42), the end portions of the radiating electrode 42 is not covered by the solar cell 50d.

This prevents deterioration of the antenna characteristic of the circular polarization antenna 4 and allows proper reception of the GPS radio waves that include time information, etc.

In the present embodiment, the metal electrode 54, the semiconductor layer 55, and the transparent electrode 56 are removed from the portions of the circular polarization antenna 4 covering the end portions of the radiating electrode 42, while the solar panel 5 itself is in the size nearly equal to the size of the dial 1 and is arranged to cover the entire dial 1.

When the timepiece 100 is viewed from the dial 1 side, a borderline around the antenna does not stand out compared to the case when the portion of the solar panel corresponding to the circular polarization antenna 4 is notched, and the design property of the timepiece 100 can be improved.

Further, in the present embodiment, the pointer shaft 31 is provided in the center of the module 3, to which the plurality of pointers 2 are connected to rotate about the shaft of the pointer shaft 31 on the top face of the dial 1. The circular polarization antenna 4 is arranged at the position away from the pointer shaft 31.

It is, therefore, not necessary to form a hole to which the pointer shaft 31 is inserted in the circular polarization antenna 4. Accordingly, a large area of the radiating electrode can be secured and the deterioration of the antenna characteristics of the circular polarization antenna 4 can be avoided.

Also in the present embodiment, the connecting positions between the light receiving surface arranged at the position corresponding to the radiating electrode 42 (light receiving surface of the solar cell 50d in the present embodiment) and other light receiving surfaces (light receiving surfaces of the solar cells 50c, 50e of the present embodiment) are provided at the positions apart from the power feed point 43.

When the case that store the module 3, the solar panel 5, etc. is made of a metallic material, the power feed point 43 is provided at the position closer to the pointer shaft 31 in order to separate the power feed point 43 from the case as far as possible. By separating the connecting positions of the solar cell 50 from the power feed point 43 provided on the side of the pointer shaft 31 (i.e., closer to the center of the timepiece 100), the connecting positions of the solar cell 50 are provided at or in the vicinity of the end portions of the circular polarization antenna 4, such that the influence on the radiating pattern can be suppressed. Therefore, the influence caused by the solar panel 5 on the antenna characteristics of the circular polarization antenna 4 can be minimized.

Second Embodiment

Next, a second embodiment of the electronic device of the present invention will be described by referring to FIG. 4. The structure of a solar panel of the present embodiment is different from that of the first embodiment, and only differences from the first embodiment will be described below.

FIG. 4 is a plan view of the solar panel according to the present embodiment.

As in the first embodiment, a through hole 61 in which the pointer shaft 31 is inserted is formed in nearly the center of the solar panel 6, as illustrated in FIG. 4.

In the present embodiment, the solar panel 6 is constituted by a plurality of solar cells 60 (six solar cells 60a to 60f in the present embodiment) including solar cells 60 (indicated as the solar cells 60c and 60d in the present embodiment) each of which has a light receiving surface arranged at a position corresponding to the radiating electrode 42 of the circular polarization antenna 4.

In part of the solar cells 60c and 60d, some regions along the outer shape of the radiating electrode 42 and across the positions corresponding to end portions of the radiating electrode 42 are subjected to removal of the metal electrode, the semiconductor layer, and the transparent electrode, to thereby provide an electrode removed portion 67.

Some parts of the light receiving surfaces (first regions) of the solar cells 60c and 60d are arranged at positions corresponding to the radiating electrode 42 (positions above and substantially overlapping the radiating electrode 42), and connected to other light receiving surfaces (second regions) of the solar cells 60c and 60d at positions away from the middle point of each side of the radiating electrode 42 (e.g., at corners of the radiating electrode 42) apart from the power feed point 43 of the circular polarization antenna 4 as far as possible.

As illustrated in FIG. 4, the parts of the solar cells 60c and 60d overlapping the end portions of the radiating electrode 42 (i.e., connecting portions between the light receiving surfaces of the first regions and the light receiving surfaces of the second regions) can be formed with the narrowest possible width within a range capable of maintaining the performance of the solar panel 6.

Accordingly, blocking of the spreading of the radiating pattern from the end portions of the radiating electrode 42 can be minimized.

In the present embodiment, the six solar cells 60a to 60f are formed to have areas nearly equal to one another to provide nearly the same output current.

The light receiving surfaces of the solar cells 60a to 60f are connected in series to function as one solar panel.

Specifically, the solar cell 60a is electrically connected to the adjacent solar cell 60b at a connecting portion 62a, the solar cell 60b is electrically connected to the adjacent solar cell 60c at a connecting portion 62b, the solar cell 60c is electrically connected to the adjacent solar cell 60d at a connecting portion 62c, the solar cell 60d is electrically connected to the adjacent solar cell 60e at a connecting portion 62d, and the solar cell 60e is electrically connected to the adjacent solar cell 60f at a connecting portion 62e.

The position of the connecting portion 62c connecting between the solar cells 60c and 60d is not limited to the position of the illustrated example. For example, the connecting portion may be provided at a position away from above of the circular polarization antenna 4 (e.g., in the vicinity of the through hole 61 in FIG. 4), to which the solar cells 60c, 60d are connected.

The connecting portion 62f, for example, formed on the side of the solar cell 60a is independent of the connecting portion 62f formed on the side of the solar cell 60f. A connector (connecting member) (not illustrated) is connected to each of the connecting portions 62f, 62f. The connectors are then connected to positive and negative electrodes, respectively, on the circuit board (not illustrated) to electrically connect the solar panel 6 to the circuit board. The connecting portions to be connected to the circuit board are not limited to the connecting portions 62g, 62g, and any connecting portions may be used so long as they have such structures.

Other parts of the structure are similar to those of the first embodiment, and the similar parts are indicated by the same reference signs and the description thereof will not be repeated.

Next, operation of the timepiece of the present embodiment will be described.

In the present embodiment, the solar panel 6 constituted by a plurality of solar cells 60 is formed. Among the plurality of solar cells 60, some parts (of the solar cells 60c and 60d in the present embodiment) arranged at and in the vicinity of the positions corresponding to end portions of the radiating electrode 42 are subjected to removal of the metal electrode, the semiconductor layer, and the transparent electrode, to thereby provide the electrode removed portion 67.

The light receiving surfaces of the solar cells 60a to 60f are connected in series with the connecting portions 62a to 62f, respectively. Simultaneously, the connecting portions 62a to 62f (e.g., the connecting portion 62f provided on the side of the solar cell 60a and the connecting portion 62f provided on the side of the solar cell 60f) are connected to the connectors (connecting members) which are not illustrated, and these connectors are coupled with the positive and negative electrodes, respectively, on the circuit board which is not illustrated. Accordingly, the solar panel 6 is electrically connected to the circuit board, and the power generated in the solar panel 6 becomes capable of being charged in the secondary battery.

In the present embodiment, the solar panel 6 including the solar cells 60a to 60f generates power by receiving light, and the power generated by the solar panel 6 is charged in the secondary battery.

Since the end portions of the radiating electrode 42 of the circular polarization antenna 4 have not been covered by conductive members (e.g., the metal electrode, the semiconductor layer, and the transparent electrode of the solar panel 6), as in the first embodiment, the spreading of the radiating pattern is not blocked and the circular polarization antenna 4 can properly receive the GPS radio wave.

Other parts of the embodiment are similar to those of the first embodiment, and the description thereof will not be repeated.

As described above, the present embodiment can provide the effects similar to those of the first embodiment, and the following additional effects will also be obtained.

Specifically, in the present embodiment, the light receiving surface arranged at the position corresponding to the radiating electrode 42 of the circular polarization antenna 4 is not formed by an independent solar cell. Some parts of the light receiving surfaces of the solar cells 60c and 60d are used instead to form the light receiving surfaces (light receiving surfaces of the first region) arranged above the radiating electrode 42. The light receiving surfaces of the first region are connected to other light receiving surfaces (light receiving surfaces of the second region) arranged away from above of the radiating electrode 42 to form a connected light receiving surface.

Accordingly, even when the area of the radiating electrode 42 of the circular polarization antenna 4 is small, the areas of the solar cells 60 need not to be correspondingly small to match (or smaller than) the area of the radiating electrode 42. The areas of the individual solar cells 60, therefore, can be increased and the number of the solar cells 60 in the solar panel 6 can be decreased. The resulting solar panel 6 has improved power generating efficiency and excellent productivity.

In the present embodiment, two solar cells 60 (i.e., the solar cells 60c and 60d) having the light receiving surfaces arranged at the positions corresponding to the radiating electrode 42 of the circular polarization antenna 4 are provided, but the structure of the solar cells is not limited thereto.

For example, as illustrated in FIG. 5, it may be possible to provide a connected solar cell 68 (solar cell 68c in FIG. 5) including a part of the solar cell arranged above the radiating electrode 42 (light receiving surface of the first region) and a part of the solar cell arranged away from above of the radiating electrode 42 (light receiving surface of the second region), and connecting both parts together.

In this case, the areas of the individual solar cells 68 can be increased and the number of divisions of the solar panel 6 can be further reduced to provide the solar panel 6 having improved productivity.

Since only one part of the solar cell 68 is arranged across the end portions of the radiating electrode 42, the influence on the antenna characteristics of the circular polarization antenna 4 can further be decreased.

The six solar cells 68a to 68e are also formed to have areas nearly equal to each other to output nearly the same output current.

The light receiving surfaces of the solar cells 68a to 68e are connected in series to function as one solar panel.

Specifically, the solar cell 68a is electrically connected to the adjacent solar cell 68b at a connecting portion 69a, the solar cell 68b is electrically connected to the adjacent solar cell 68c at a connecting portion 69b, the solar cell 68c is electrically connected to the adjacent solar cell 68d at a connecting portion 69c, and the solar cell 68d is electrically connected to the adjacent solar cell 68e at a connecting portion 69d.

The connecting portion 69e on the side of the solar cell 68a and the connecting portion 69e on the side of the solar cell 68e, for example, are connected to the connectors (connecting members) not illustrated, and these connectors are coupled with the positive and negative electrodes, respectively, on the circuit board which is not illustrated.

Third Embodiment

Next, a third embodiment of the electronic device according to the present invention will be described by referring to FIG. 6. The structure of a solar panel of the present embodiment is different from that of the first embodiment, and only differences from the first embodiment will be described below.

Figure 6:
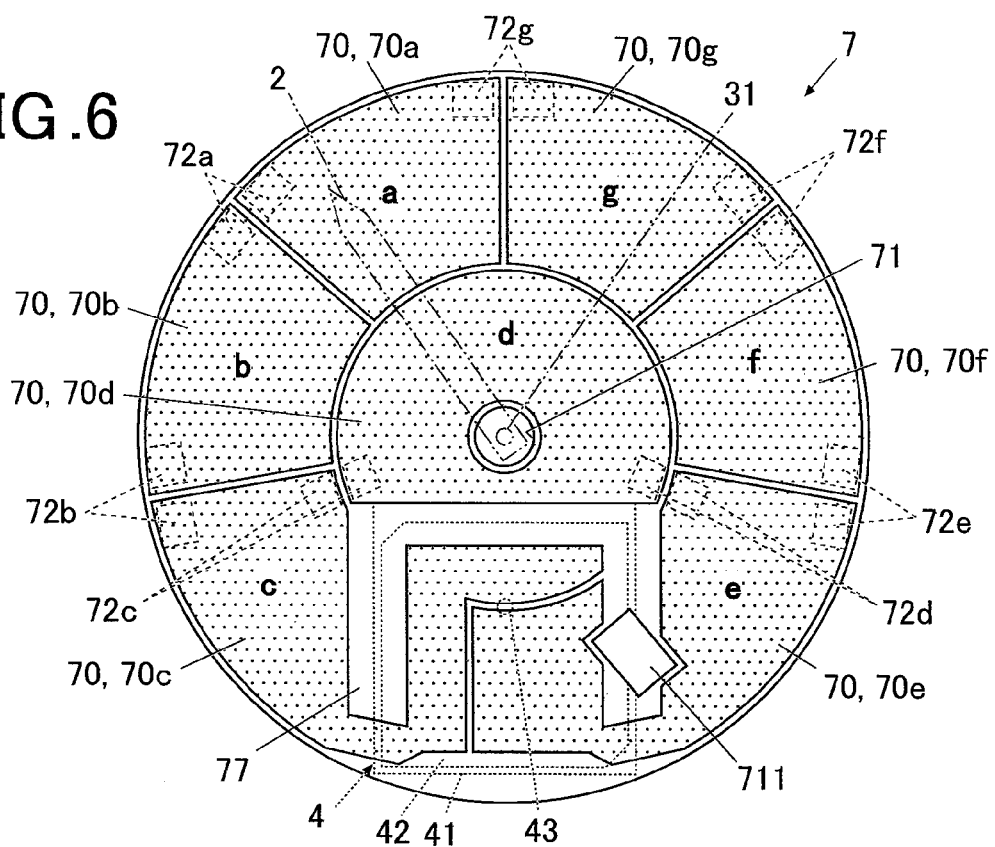
FIG. 6 is a plan view of a solar panel of the third embodiment.

FIG. 6 is a plan view of the solar panel of the present embodiment.

As in the first embodiment, a through hole 71 in which the pointer shaft 31 is inserted is formed in nearly the center of the solar panel 7, as illustrated in FIG. 6.

In the present embodiment, a solar panel 7 is constituted by a plurality of solar cells 70 (seven solar cells 70a to 70g in the present embodiment) including solar cells 70 (the solar cells 70c and 70e in the present embodiment) each of which has a light receiving surface arranged at a position corresponding to the radiating electrode 42 of the circular polarization antenna 4.

In part of the solar cells 70c and 70e, the metal electrode, the semiconductor layer, and the transparent electrode are removed along the outer shape of the radiating electrode 42 in regions across the positions corresponding to end portions of the radiating electrode 42, to thereby form an electrode removed portion 77.

Some parts of the light receiving surfaces (first regions) of the solar cells 70c and 70e are located at positions corresponding to the radiating electrode 42 (positions above and overlapping the radiating electrode 42), and connected to other light receiving surfaces (second regions) of the solar cells 70c and 70e at positions away from the middle points of each side of the radiating electrode 42 (e.g., at corners of the radiating electrode 42) apart from the power feed point 43 of the circular polarization antenna 4 as far as possible.

As illustrated in FIG. 6, the parts of the solar cells 70c and 70d overlapping the end portions of the radiating electrode 42 (i.e., connecting portions between the light receiving surfaces of the first regions and the light receiving surfaces of the second regions), can be formed with the narrowest possible width within a range capable of maintaining the performance of the solar panel 7.

Accordingly, blocking of the spreading of the radiating pattern from the end portions of the radiating electrode 42 can be minimized.

The plurality of solar cells 70a to 70g of the present embodiment are arranged radially about the pointer shaft 31 (indicated by two-dot lines in FIG. 6) in such a manner that the pointers 2 (indicated by two-dot lines in FIG. 6) moving above the solar cells 70a to 70g overlap at least two solar cells among the plurality of solar cells 70a to 70g.

Specifically, in the present embodiment, the solar cell 70d is arranged in nearly the center of the solar panel 7, and other solar cells 70a to 70c and 70e to 70g are arranged circumferentially along the solar panel 7 so as to surround the solar cell 70d.

Accordingly, the pointers 2 always overlap the solar cell 70d and at least one of the solar cells 70a to 70c and 70e to 70g, regardless of the pointing direction of the pointers 2.

Specifically, as illustrated in FIG. 6, when the pointers 2 point the direction of three o'clock in the timepiece, the pointers 2 overlap two solar cells 70 of the solar cells 70d and 70f. When the pointers 2 point the direction of six o'clock in the timepiece, the pointers 2 overlap three solar cells 70 of the solar cells 70d, 70c, and 70e.

In part of the solar cells 70 covered by the pointers 2, the power generating efficiency is decreased because the light does not or is hard to transmit through such part.

Specifically, in the solar cells 70 with overlapping pointers 2, a light receiving area (area capable of generating power) is decreased only in the part covered by the pointers 2.

Since the pointers 2 are arranged linearly from the pointer shaft 31 toward the periphery of the solar panel 7, if the solar panel 7 is divided radially, the area capable of generating power would be largely different between the solar cell 70 covered by the pointers 2 and the solar cell 70 uncovered by the pointers 2.

The power generation amount of each solar cell 70 decreases according to the power generation amount of the least power generating solar cell 70 (i.e., the solar cell 70 covered by the pointers 2). Decrease of the power generation amount due to the decrease of the light receiving areas of some solar cells 70 would result in a large decrease of the power generating efficiency of the entire solar panel 7.

When the pointers 2 overlap at least two solar cells 70, therefore, the part of the light receiving surfaces of the solar cells 70 where the power generation is prohibited can be distributed over a plurality of solar cells 70 to suppress variations of the power generation amount. Accordingly, the power generating efficiency of the entire solar panel 7 can be improved.

In the present embodiment, the seven solar cells 70a to 70g are formed to have areas nearly equal to each other to provide nearly the same output current.

The solar cell 70d that is kept overlapped by the pointers 2 regardless of the pointing direction of the pointers 2 may be formed larger than other solar cells 70a to 70c and 70e to 70g by an area equivalent to the area of the part overlapped by the pointers 2. Accordingly, the substantial output current of the solar cells 70a to 70g can be matched more precisely.

In particular, as the pointers 2 are generally wider at the base end portions mounted on the pointer shaft 31 and become narrower toward the tip end portions, the influence would be small when the tip end side of the pointers 2 overlaps the solar cells 70. If the pointers 2 are short, the tip ends of the pointers 2 may not reach the solar cells 70a to 70c and 70e to 70g surrounding the solar cell 70d. By forming the solar cell 70d overlapped by the base end portions of the pointers 2 to be larger by an area equivalent to the area of the overlapping pointers 2, the decrease of the power generation efficiency caused by the overlapping of the pointers 2 on the solar cells 70 can be overcome efficiently.

The light receiving surfaces of the solar cells 70a to 70g are connected in series to function as one solar panel.

Specifically, the solar cell 70a is electrically connected to the adjacent solar cell 70b at a connecting portion 72a, the solar cell 70b is electrically connected to the adjacent solar cell 70c at a connecting portion 72b, the solar cell 70c is electrically connected to the adjacent solar cell 70d at a connecting portion 72c, the solar cell 70d is electrically connected to the adjacent solar cell 70e at a connecting portion 72d, the solar cell 70e is electrically connected to the adjacent solar cell 70f at a connecting portion 72e, and the solar cell 70f is electrically connected to the adjacent solar cell 70g at a connecting portion 72f.

For example, the connecting portion 72g formed on the side of the solar cell 70a is independent of the connecting portion 72g formed on the side of the solar cell 70g. The connecting portions 72g, 72g are coupled with connectors (connecting members) which are not illustrated. The connectors are connected to positive and negative electrodes, respectively, on the circuit board (not illustrated) to electrically connect the solar panel 7 to the circuit board. The connecting portions coupled with the circuit board are not limited to the connecting portions 72g, 72g, and any connecting portions may be used so long as they have such structures.

In the present embodiment, a date wheel (not illustrated) is arranged in the module, and a date display window (not illustrated) that displays a date is provided on the dial.

On the solar panel 7, an opening 711 for displaying the date is formed at a position corresponding to the date display window of the dial.

In the present embodiment, the opening 711 for displaying the date is provided in the electrode removed portion 77 of the solar panel 7 that cannot be used for power generation.

The opening 711 for displaying the date is provided without affecting the power generation amount of the solar panel 7.

Other parts of the structure are similar to those of the first embodiment, and the similar parts are indicated by the same reference signs and the description thereof will not be repeated.

Next, operation of the timepiece of the present embodiment will be described.

In the present embodiment, the solar panel 7 is formed by arranging the plurality of solar cells 70 radially around the pointer shaft 31.

Among the plurality of solar cells 70, some parts (of the solar cells 70c and 70e in the present embodiment) arranged at or in the vicinity of the positions corresponding to the end portions of the radiating electrode 42 are subjected to removal of the metal electrode, the semiconductor layer, and the transparent electrode, to thereby provide the electrode removed portion 77.

The light receiving surfaces of the solar cells 70a to 70g are connected in series with the connecting portions 72a to 72g, respectively. Simultaneously, some of the connecting portions 72a to 72g (e.g., the connecting portion 72g provided on the side of the solar cell 70a and the connecting portion 72g provided on the side of the solar cell 70g) are connected to the connectors (connecting members) which is not illustrated, and these connectors are coupled with the positive and negative electrodes, respectively, on the circuit board which is not illustrated. Accordingly, the solar panel 7 is electrically connected to the circuit board, and the power generated in the solar panel 7 becomes capable of being charged in the secondary battery.

In the present embodiment, the solar panel 7 constituted by the solar cells 70a to 70g generates power by receiving light, and the power generated by the solar panel 7 is charged in the secondary battery.

Since the end portions of the radiating electrode 42 of the circular polarization antenna 4 are not covered by conductive members (e.g., the metal electrode, the semiconductor layer, and the transparent electrode of the solar panel 7), as in the first embodiment, the spreading of the radiating pattern is not blocked and the circular polarization antenna 4 can properly receive the GPS radio wave.

Other parts of the present embodiment are similar to those of the first embodiment, and the description thereof will not be repeated.

As described above, the present embodiment can provide the effects similar to those of the first embodiment, and the following additional effects will also be obtained.

Specifically, in the present embodiment, the plurality of solar cells 70 that constitute the solar panel 7 are arranged radially around the pointer shaft 31 in such a manner that the pointers 2 moving over the solar cells 70 overlap at least two solar cells among the plurality of solar cells 70.

Accordingly, the variation in the power generation amount among the solar cells 70 caused by the overlap of the pointers 2 on some solar cells 70 can be minimized. As a result, the power generating efficiency of the entire solar panel 7 can be improved.

In the present embodiment, two solar cells 70 (i.e., the solar cells 70c and 70e) are arranged at the position corresponding to the radiating electrode 42 of the circular polarization antenna 4, but the structure of the solar cells are not limited thereto.

Figure 7:
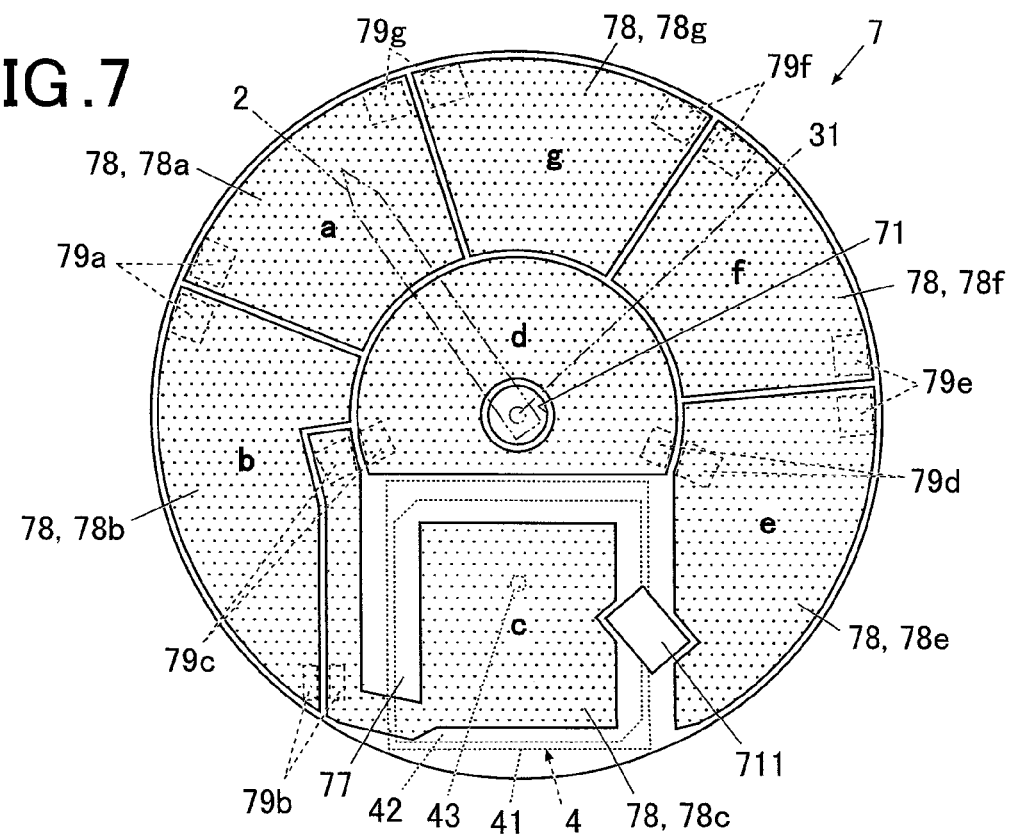
FIG. 7 is a plan view of a modification of the solar panel in FIG. 6.

For example, as illustrated in FIG. 7, it is possible to provide a connected solar cell 78 (solar cell 78c in FIG. 7) including a part of the solar cell arranged above the radiating electrode 42 (light receiving surface of the first region) and a part of the solar cell arranged away from above of the radiating electrode 42 (light receiving surface of the second region), and connecting the light receiving surfaces of both parts together.

In this case, only one part of the solar cell 78 is arranged across the end portions of the radiating electrode 42, such that the influence on the antenna characteristics of the circular polarization antenna 4 can further be decreased.

Also in this case, the seven solar cells 78a to 78g are formed to have areas nearly equal to each other to output nearly the same output current.

The light receiving surfaces of the solar cells 78a to 78g are connected in series to function as one solar panel.

Specifically, the solar cell 78a is electrically connected to the adjacent solar cell 78b at a connecting portion 79a, the solar cell 78b is electrically connected to the adjacent solar cell 78c at a connecting portion 79b, the solar cell 78c is electrically connected to the adjacent solar cell 78d at a connecting portion 79c, the solar cell 78d is electrically connected to the adjacent solar cell 78e at a connecting portion 79d, the solar cell 78e is electrically connected to the adjacent solar cell 78f at a connecting portion 79e, and the solar cell 78f is electrically connected to the adjacent solar cell 78g at a connecting portion 79f.

For example, the connecting portion 79g on the side of the solar cell 78a and the connecting portion 79g on the side of the solar cell 78g are connected to the connectors (connecting members) not illustrated, and these connectors are coupled with the positive and negative electrodes, respectively, on the circuit board which is not illustrated.

Fourth Embodiment

Next, a fourth embodiment of the electronic device according to the present invention will be described by referring to FIGS. 8 and 9. In the present embodiment, the solar cells are connected in such a manner that is different from that of the first embodiment, and only differences from the first embodiment will be described below.

Figure 8:
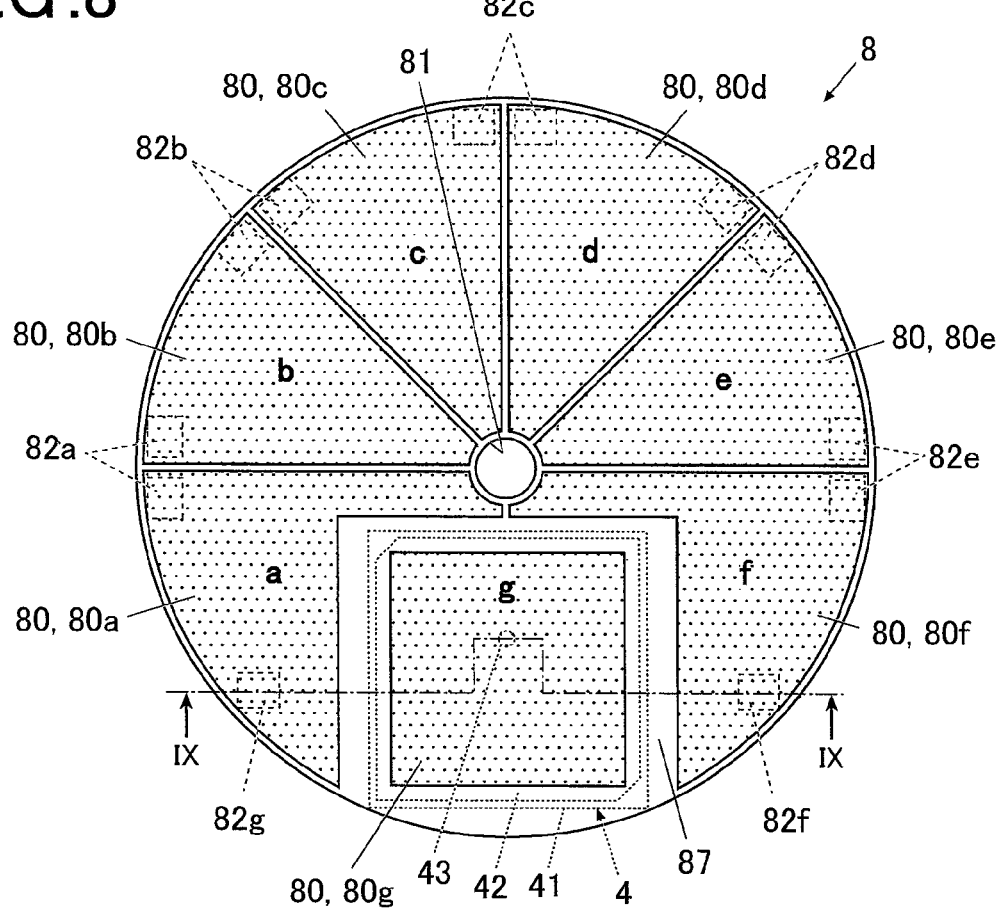
FIG. 8 is a plan view of a solar panel of the fourth embodiment.
Figure 9:
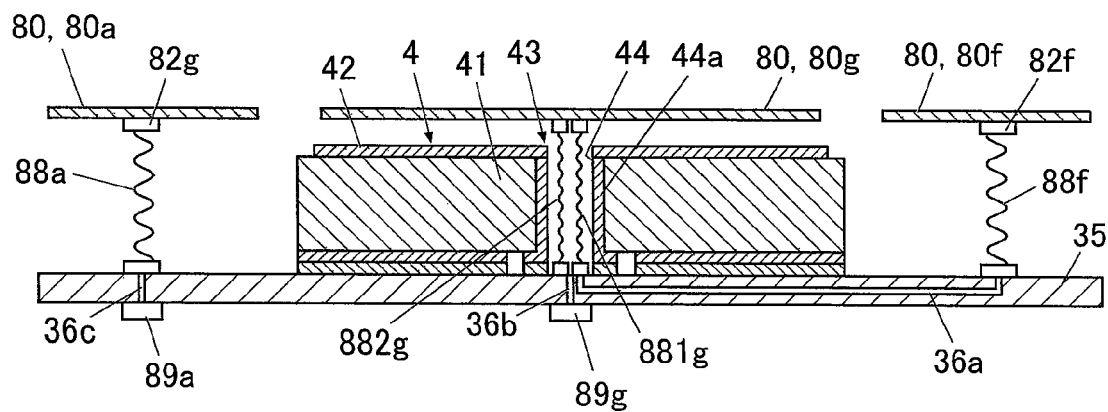
FIG. 9 is a sectional view of the solar panel along line IX-IX of FIG. 8.

FIG. 8 is a plan view of the solar panel of the present embodiment, and FIG. 9 is a sectional view of the solar panel along line IX-IX of FIG. 8.

As illustrated in FIG. 8, a through hole 81 in which the pointer shaft 31 is inserted is formed in nearly the center of the solar panel 8 as in the first embodiment.

In the present embodiment, the solar panel 8 is constituted by a plurality of solar cells 80 (seven solar cells 80a to 80g in the present embodiment) including a solar cell 80 (solar cell 80g in the present embodiment) that has a light receiving surface arranged at a position corresponding to the radiating electrode 42 of the circular polarization antenna 4.

In the periphery of the solar cells 80g, some regions along the outer shape of the radiating electrode 42 and across the positions corresponding to end portions of the radiating electrode 42 are subjected to removal of the metal electrode, the semiconductor layer, and the transparent electrode, to thereby provide an electrode removed portion 87.

In the present embodiment, the seven solar cells 80a to 80g are formed to have areas nearly equal to each other to provide nearly the same output current.

The light receiving surfaces of the solar cells 80a to 80g are connected in series to function as one solar panel.

Specifically, the solar cell 80a is electrically connected to the adjacent solar cell 80b at a connecting portion 82a, the solar cell 80b is electrically connected to the adjacent solar cell 80c at a connecting portion 82b, the solar cell 80c is electrically connected to the adjacent solar cell 80d at a connecting portion 82c, the solar cell 80d is electrically connected to the adjacent solar cell 80e at a connecting portion 82d, and the solar cell 80e is electrically connected to the adjacent solar cell 80f at a connecting portion 82e.

In addition, as illustrated in FIG. 9, a through hole 44 is formed in the circular polarization antenna 4 of the present embodiment at a position corresponding to the power feed point 43. A conductive film 44a is formed by, for example, vapor deposition of a metallic material, etc., and provided on the inner surface of the through hole 44. The conductive film 44a functions as a power feeding member that feeds power to the radiating electrode 42. The power feeding member that feeds power to the radiating electrode 42 is not limited to the conductive film 44a. For example, a power feeding pin, a coaxial cable, etc. may be inserted as the power feeding member into the through hole 44.

The connecting portion 82f of the solar cell 80f is electrically connected to a substrate inner layer pattern 36a on the side of the circuit board 35 via a connector (connecting member) 88f.

Meanwhile, a connector (connecting member) 881g having one end thereof connected to the solar cell 80g and the other end thereof connected to the substrate inner layer pattern 36a on the side of the circuit board 35 is inserted into the through hole 44 formed at the power feed point 43 of the circular polarization antenna 4. As a result, the solar cell 80g is electrically connected to the solar cell 80f within the circuit board 35 via a substrate inner layer pattern 36a.

In addition, a connector (connecting member) 882g having one end thereof connected to the solar cell 80g and the other end thereof connected to a substrate inner layer pattern 36b on the side of the circuit board 35 is inserted into the through hole 44. As a result, the solar cell 80g is electrically connected to a negative electrode 89g on the side of the circuit board 35 via the substrate inner layer pattern 36b.

The connecting portion 82g of the solar cell 80a is electrically connected to a substrate inner layer pattern 36c on the side of the circuit board 35 via a connector (connecting member) 88a, and is electrically connected to a positive electrode 89a on the side of the circuit board 35 via the substrate inner layer pattern 36c. As a result, the solar panel 8 is electrically connected to the circuit board 35.

Other parts of the structure are similar to those of the first embodiment, and the similar parts are indicated by the same reference signs and the description thereof will not be repeated.

Next, operation of the timepiece of the present embodiment will be described.

In the present embodiment, the solar panel 8 constituted by a plurality of solar cells 80 is formed. Among the plurality of solar cells 80, a portion of the solar cell 80g arranged at the position corresponding to the end portions of the radiating electrode 42 is subjected to removal of the metal electrode, the semiconductor layer, and the transparent electrode around the solar cell 80g, to thereby provide the electrode removed portion 87.

The light receiving surfaces of the solar cells 80a to 80g are connected in series with the connecting portions 82a to 82g. Simultaneously, the solar cell 80g is electrically connected to the negative electrode 89g provided on the side of the circuit board 35 via a connector (connecting member) 882g and the substrate inner layer pattern 36b. The connecting portion 82g of the solar cell 80a is electrically connected to the positive electrode 89a on the side of the circuit board 35 via the connector (connecting member) 88a and the substrate inner layer pattern 36c. Accordingly, the solar panel 8 is electrically connected to the circuit board 35, and the power generated in the solar panel 8 becomes capable of being charged in the secondary battery.

In the present embodiment, the solar panel 8 constituted by the solar cells 80a to 80g generates power when the light is incident on the solar panel 8. The power generated by the solar panel 8 is charged in the secondary battery.

Since the end portions of the radiating electrode 42 of the circular polarization antenna 4 are not covered by conductive members (e.g., the metal electrode, the semiconductor layer, and the transparent electrode of the solar panel 8), as in the first embodiment, the spreading of the radiating pattern is not prevented and the circular polarization antenna 4 can properly receive the GPS radio wave.

Other parts of the embodiment are similar to those of the first embodiment, and the description thereof will not be repeated.

As described above, the present embodiment can provide the effects similar to those of the first embodiment, and the following additional effects will also be obtained.

Specifically, in the present embodiment, the connector 881g is provided in the through hole 44 of the power feed point 43 of the circular polarization antenna 4, whereby the solar cell 80g having the light receiving surface arranged at the position corresponding to the radiating electrode 42 of the circular polarization antenna 4 is electrically connected to another solar cell 80 (solar cell 80f in FIG. 8) in the circuit board 35.

Accordingly, the solar cell 80g is not necessarily connected electrically to another solar cell 80f above the radiating electrode 42 of the circular polarization antenna 4, and there is no conductive member portion provided across the end portions of the radiating electrode 42. As a result, the influence on the antenna characteristics of the circular polarization antenna 4 can be avoided and the receiving performance thereof can be improved.

Although the embodiments of the present invention have been described, it is apparent that the present invention is not limited to the above embodiments, and various modifications may be provided without departing from the scope of the invention.

For example, only one circular polarization antenna 4 has been provided in the illustrated examples of the first to fourth embodiments above, but the number of the circular polarization antenna 4 is not limited thereto.

If more than one circular polarization antenna 4 are provided, all the solar cells having the light receiving surfaces provided at positions corresponding to the radiating electrode 42 among the plurality of solar cells should be adjusted in size or shape so as not to stick out of the radiating electrode 42.

In the first to fourth embodiments, the light receiving surface of the solar cell arranged at the position corresponding to the radiating electrode 42 has been illustrated to be small enough to fit inside of each side of the radiating electrode 42. However, when a slit or a notch is formed in the radiating electrode 42, the light receiving surface of the solar cells may preferably be arranged at a position further inside of the position where the slit or notch is provided.

Further, the way of dividing the solar panel (number and shape of the divided solar cells) is not limited to those illustrated in the first to fourth embodiments above.

In the first to fourth embodiments above, the timepiece provided as the electronic device is the analogue timepiece 100 that displays time and the like by rotating the pointers 2 on the dial 1, but the timepiece may not be the analogue type timepiece.

For example, a digital type timepiece including a dial (e.g., a liquid crystal display unit) that displays various information such as time, calendar information, and the like by letters or the like may be provided. Alternatively, the electronic device may include the dial having both analogue and digital type display units.

Although the electronic device has been provided as a timepiece in the first to fourth embodiments, the electronic device is not limited thereto.

Alternatively, any electronic device may be used so long as it receives the GPS radio waves by the circular polarization antenna to obtain various information such as time information, generates power by the solar panel, and uses the generated power as driving source. For example, the electronic device may be realized by such devices as a pedometer, a biological information display device such as a heart rate meter or a pulsometer, and a display device that displays various information including a moving distance, moving pace information, altitude information, or atmospheric pressure information.

Fifth Embodiment

A fifth embodiment of an electronic device of the present invention will be described by referring to FIGS. 10 to 12.

In the embodiments described below, various limitations considered to be technically preferable to implement the present invention are provided, but those limitations are not intended to limit the scope of the present invention to the embodiments below and accompanying illustrated examples.

In the present embodiment, the electronic device will be described when it is realized as an analogue type timepiece that displays time, etc. by movement of hands.

Figure 10:
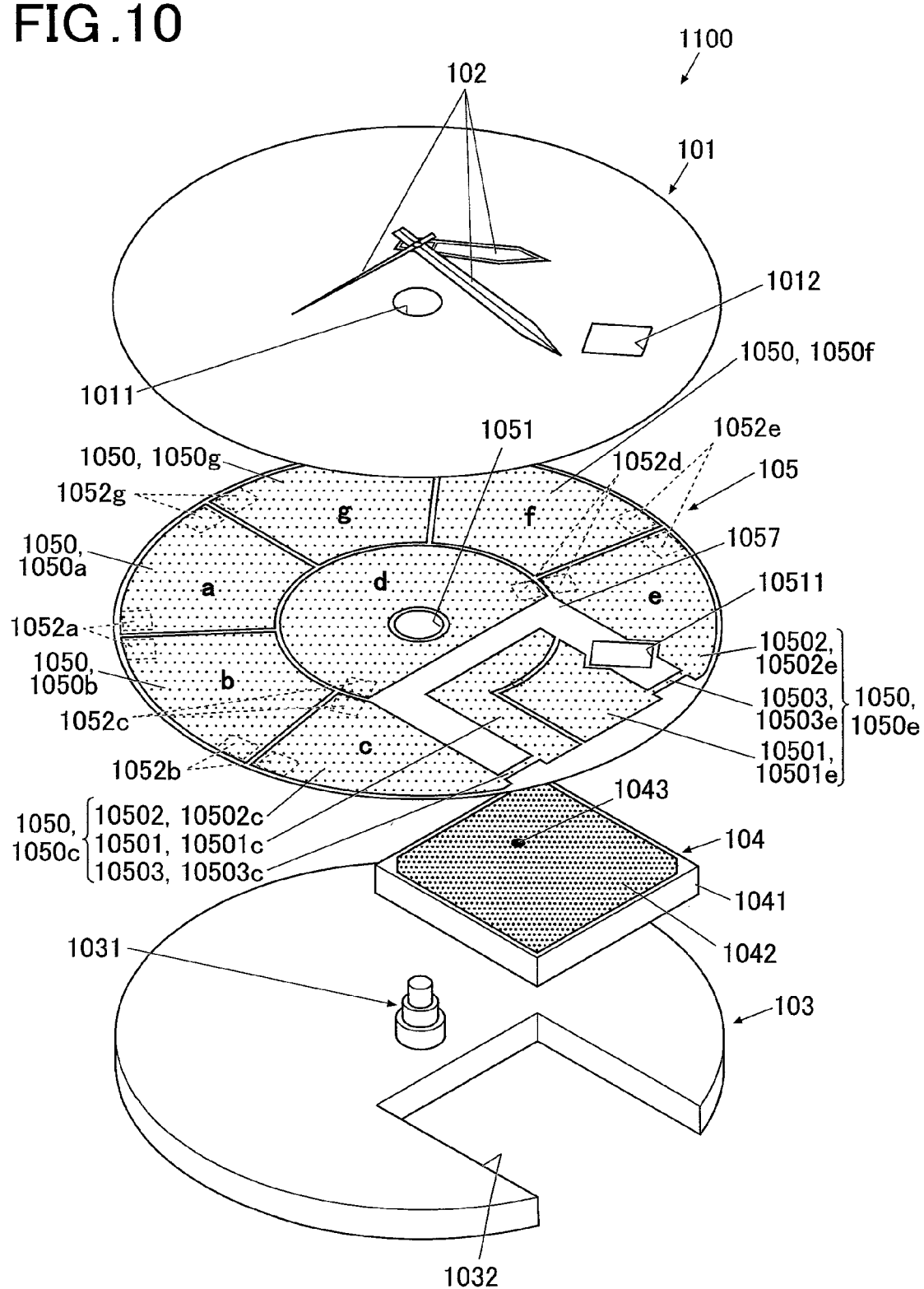
FIG. 10 is an exploded perspective view of a timepiece of the fifth embodiment.

FIG. 10 is an exploded perspective view of a timepiece of the present embodiment.

As illustrated in FIG. 10, a timepiece 1100 of the present embodiment includes a dial 101, a module 103 including a circular polarization antenna 104, and a solar panel 105.

The timepiece 1100 also includes a secondary battery (not illustrated) to which power generated by the solar panel 5 is charged to form a power source unit of the timepiece 1100.

The dial 101, the module 103, and the circular polarization antenna 104, the solar panel 105, and the secondary battery are stored in a case which is not illustrated.

In the present embodiment, the dial 101 is arranged on the viewing side of the timepiece 1100 as an analogue type dial that displays time by pointers 102 including an hour hand and a minute hand.

A through hole 1011 is formed in nearly the center of the dial 101. A pointer shaft 1031, to which the pointers 102 are mounted, is inserted in the through hole 1011.

The timepiece 1100 of the present embodiment includes a circular polarization antenna 104 that receives GPS waves made of microwaves which will be described later. Preferably, therefore, the dial 101 is made of a non-metallic material, such as resin or glass through which microwaves can transmit.

The timepiece 1100 also includes the solar panel 105 that receives light to generate power. Therefore, the dial 101 is made of a transparent or a semi-transparent material having a light transmission characteristic.

The dial 101 may also be formed by vapor deposition of a metal film on the surface of a base material made of, for example, a transparent or semi-transparent resin or glass, such that the metal film has a thickness so as not to attenuate the microwave nor prevent transmission of light.

The module 103 is arranged under the dial 101 (that is, on the back side of the timepiece 1100), and includes, for example, a timepiece movement formed by a wheel train mechanism, a motor, etc. to move the pointers 102, a communication module connected to the circular polarization antenna 104, and a circuit board having various electronic components, such as a control circuit to display time by the pointers 102 (none of which are illustrated). The module 103 is stored in a housing (not illustrated) made of resin or the like.

The control circuit provided in the timepiece 1100 of the present embodiment has a function to correct internal time of the timepiece 1100 by using time information or the like included in the GPS radio waves to provide exact time.

In the present embodiment, a pointer shaft 1031 is provided in nearly the center of the module 103 to protrude upward from the movement side.

The pointer shaft 1031 is formed by a plurality of rotation shafts of, for example, hour, minute, and second hands placed on top of each other on the same axis. The pointer shaft 1031 is inserted in the through hole 1051 of the solar panel 105 and the through hole 1011 of the dial 101, which will be described later, and the corresponding pointers 102 (e.g., hour, minute, and second hands) are connected to the rotation shafts.

When the movement is operated to rotate the pointer shaft 1031, the pointers 102 mounted on the rotation shafts of the pointer shaft 1031 rotate independently on the top face of the dial 1 about the pointer shaft 1031.

At one end portion of the module 103 along the outer periphery thereof, an antenna fitting portion 1032 where the circular polarization antenna 104 is fitted is formed.

The antenna fitting portion 1032 is a notch or a recess along the outer shape of the circular polarization antenna 104.

Preferably, the top face of the module 103 is in the same plane with the top face of the circular polarization antenna 4 in a state where the circular polarization antenna 104 is fitted in the antenna fitting portion 1032.

The circular polarization antenna 104 can receive GPS radio waves provided as circularly polarized microwaves (that is, the radio waves that contain time information, etc. transmitted from GPS satellites). A patch antenna, for example, is preferably used.

The GPS radio waves include data consisting of time information from highly precise atomic timepieces mounted on the GPS satellites, almanac data (or orbital information) of outline precision of all satellites, which is updated about every six days, and ephemeris data of satellites themselves, which is updated about every ninety minutes. The data are transmitted from each GPS satellite to the ground by the radio waves (microwaves) in the frequency band of L1 (1575.42 MHz) or L2 (1227.60 MHz).

The timepiece 1100 receives the GPS wave from at least one of the plurality of GPS satellites by the circular polarization antenna 4, and uses the time information, etc. included therein to perform time correction of internal time of the timepiece 1100 to provide exact time.

The GPS radio waves also include orbital information that indicates positions of the GPS satellites on the orbit as mentioned above. The timepiece 1100, therefore, may also receive the GPS radio waves that have been transmitted from the plurality of GPS satellites by the circular polarization antenna 104 to execute positioning calculations using the time information and the orbital information included in the GPS radio waves.

As illustrated in FIG. 10, the circular polarization antenna 104 of the present embodiment is formed in the shape of a rectangle in a planar view, and includes a base 1041 with a radiating electrode 1042 (radiating element) arranged thereon. The shape of the circular polarization antenna 104 is not limited to the illustrated example.

The base 1041 is made of a dielectric material, such as ceramics.

The radiating electrode 1042 is made of a material, such as silver foil, a metal plate, or a metal film having a predetermined thickness.

Size (e.g., length of each side) of the radiating electrode 1042 is optimized according to the frequency, etc. of the radio waves that the circular polarization antenna 104 should receive. In the present embodiment, it has been adjusted such that the highest antenna characteristic can be obtained in the frequency band of the GPS radio waves.

A power feed point 1043 that feeds power to the radiating electrode 1042 is provided at a position of the circular polarization antenna 104 having a circular polarization characteristic, that is, a position where impedance can be matched.

The system of feeding power to the radiating electrode 1042 is not limited to a particular system.

Alternatively, a through hole (not illustrated) may be formed in a position corresponding to the power feed point 1043 so as to penetrate the circular polarization antenna 104 in a thickness direction thereof, to thereby insert a power feeding member (e.g., a power feeding pin, coaxial cables, etc.) (not illustrated) in the through hole to feed power to the radiating electrode 42.

As described above, the circular polarization antenna 104 of the present embodiment is fitted in the antenna fitting portion 1032 formed in the module 103.

Figure 11:
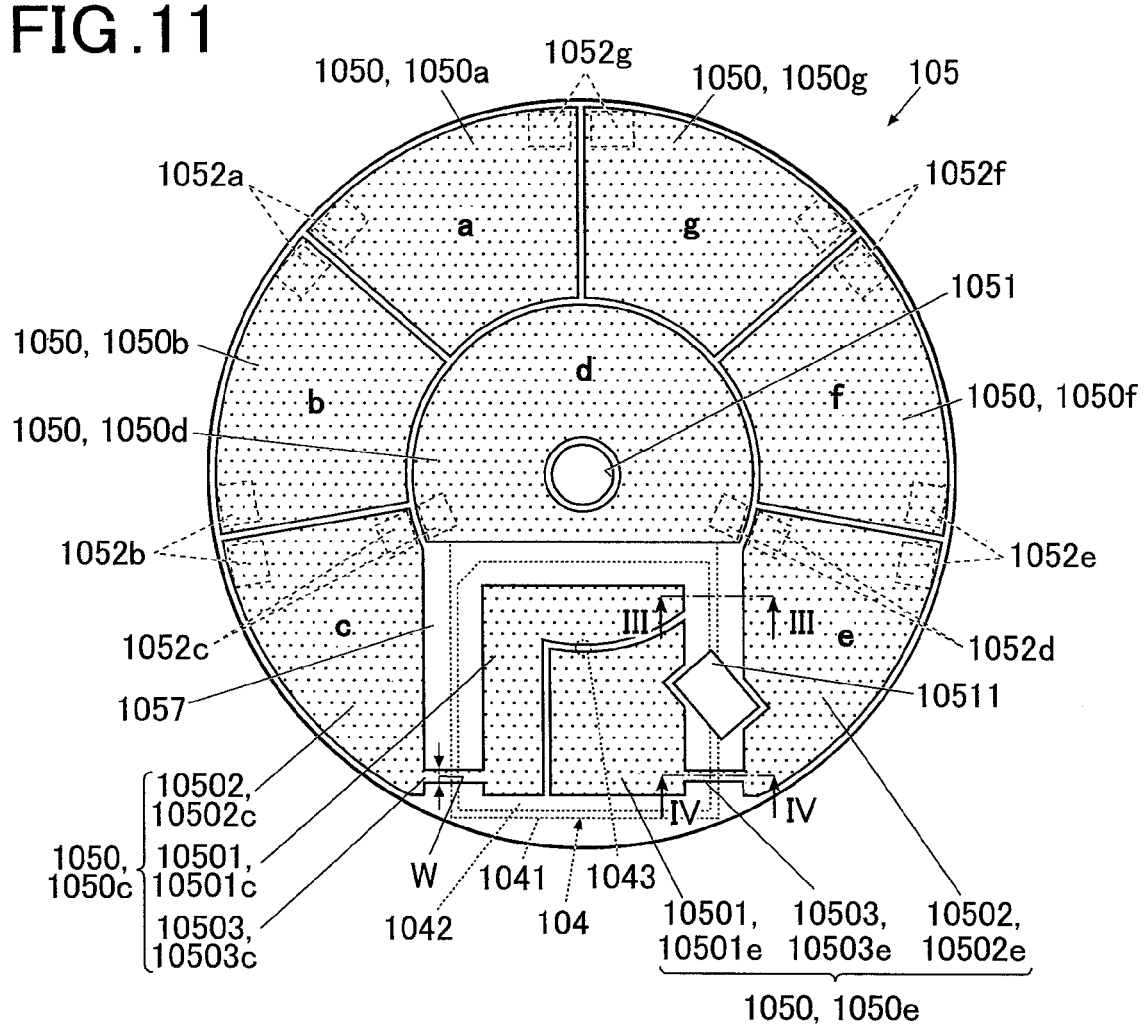
FIG. 11 is a plan view of a solar panel of the fifth embodiment.

In a state where the circular polarization antenna 104 is fitted in the antenna fitting portion 1032, the circular polarization antenna 104 is placed at a position away from the pointer shaft 1031 (see FIG. 11). The position where the circular polarization antenna 104 is provided or placed is not limited to the illustrated example.

The circular polarization antenna 104 is configured to spread the radiating pattern from end portions (peripheral portions) of the radiating electrode 1042.

In the present embodiment, the radiating electrode 1042 is formed in nearly a square, and the radiating pattern spreading from each side (peripheral portion) largely affects antenna characteristics (antenna radio wave reception performance) of the circular polarization antenna 104.

It is, therefore, important not to block the spreading of the radiating pattern from each side of the radiating electrode 1042 to improve the antenna characteristics of the circular polarization antenna 104.

The solar panel 105 generates power by receiving light, and the power generated by the solar panel 105 is charged in the secondary battery.

The solar panel 105 of the present embodiment is arranged between the dial 1 and the module 103, and has an area corresponding to the area of the dial 101 in a face direction thereof.

The dial 101 of the present embodiment is made of a material having the light transmission characteristic as mentioned above, and a maximally large area of the solar panel 105 can be secured by making it correspond to the area of the dial 101 in the face direction.

The shape and the like of the solar panel 105 are not particularly limited. It is sufficient that the solar panel 105 has mostly the same area as the area of the dial 101 in the plane direction and substantially overlaps the dial 101. The area and shape of the solar panel 105 may not exactly match those of the dial 1.

Figure 12:
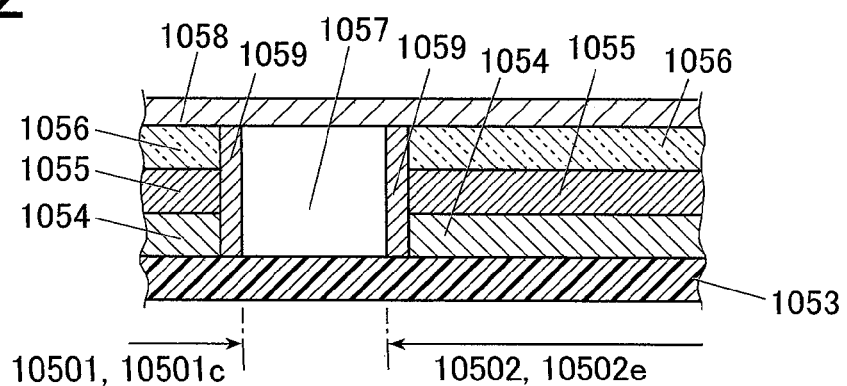
FIG. 12 is a sectional view of the solar panel along line III-III of FIG. 11.
Figure 13:
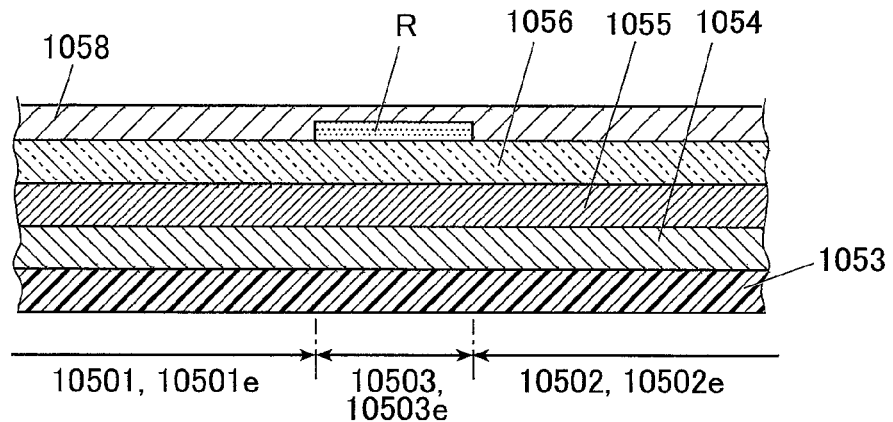
FIG. 13 is a sectional view of the solar panel along line IV-IV of FIG. 11.

FIG. 11 is a plan view of the solar panel 105 of the present embodiment, and FIGS. 12 and 13 are sectional views of the solar panel 105 along line III-III and line IV-IV, respectively, of FIG. 11.

As illustrated in FIGS. 10 and 11, the through hole 1051 is formed in nearly the center of the solar panel 105 to which the pointer shaft 1031 is inserted.

The solar panel 105 of the present embodiment has a plurality of solar cells 1050 (seven solar cells 1050a to 1050g in the present embodiment). The plurality of solar cells 1050 include a solar cell 1050 (indicated as solar cells 1050c, 1050e in the present embodiment) arranged above the radiating electrode 1042 of the circular polarization antenna 104 and having light receiving surfaces (surfaces capable of receiving light and generating power).

The solar cells 1050c, 1050e include first light receiving regions 10501 arranged above the radiating electrode 1042 of the circular polarization antenna 104, second light receiving regions 10502 arranged at a position away from the above of the radiating electrode 1042, and connecting regions 10503 that connect the first and second light receiving regions 10501 and 10502.

In the description below, among the first and second light receiving regions 10501 and 10502, and connecting regions 10503 on the solar panel 105, those included in the solar cell 1050c are identified by adding a suffix "c", and those included in the solar cell 1050e are identified by adding a suffix "e".

As mentioned above, the circular polarization antenna 104 is configured to spread the radiating pattern from the end portions (peripheral portions) of the radiating electrode 1042. If the end portions of the radiating electrode 1042 are covered by such a member as to prevent transmission of the radio waves, the antenna characteristics (radio wave receiving performance) of the circular polarization antenna 104 would deteriorate.

In the present embodiment, therefore, the solar cells 1050 having the light receiving surfaces arranged above the radiating electrode 1042 are formed to have the first light receiving regions 10501 configured to overlap or be smaller than the radiating electrode 1042 so as not to cover the end portions of the radiating electrode 1042. The first light receiving regions 10501 are connected to the second light receiving regions 10502, which are arranged at a position away from above of the radiating electrode 1042, via the connecting regions 10503 provided across the end portions of the radiating electrode 1042. As a result, a connected light receiving portion is provided, and the first light receiving regions 10501 can effectively function as the light receiving portions.

The connecting regions 10503 are provided at positions away from the middle point of each side of the radiating electrode 1042 (e.g., at corners of the radiating electrode 1042) and apart from the power feed point 1043 of the circular polarization antenna 104 as far as possible. Also, the connecting regions 10503 are formed as constricted portions having a width W that is narrower than the widths of the first and second light receiving regions 10501 and 10502. The width W of the connecting regions 10503 affects the power generation capacity of the solar panel 105, which will be described later, and is equal to or less than a predetermined value according to a light transmission rate of the dial 101 and a total area of the solar cells 1050 including the connecting regions 10503. The term "predetermined value" refers to a width of the connecting regions 10503 with which current amount of the connecting regions 10503 is restricted in the power generation state of the solar panel 105 when a conductive reinforcing material R, which will be described later, is not provided in the connecting regions 10503. By forming the connecting regions 10503 to be constricted portions, the blocking of the spreading of the radiating pattern from the end portions of the radiating electrode 1042 can be minimized.

The connecting regions 10503 need to be constricted only in the portions across the end portions of the radiating electrode 1042. That is, the shape of the connecting regions 10503 are not particularly limited so long as the constricted portions are provided across the end portions of the radiating electrode 1042.

As illustrated in FIG. 12, the solar panel 105 is formed in a stacked structure including a metal electrode 1054 formed on a resin substrate 1053, followed by a semiconductor layer 1055, a transparent electrode 1056, and a protective layer (protective film) 1058 stacked on top of one another in this order. In addition, an insulating layer 1059 is arranged on the sides of the stacked structure.

The resin substrate 1053 is a flexible film type substrate. A material of the resin substrate 1053 is not limited to a particular material, and plastic or the like may be used.

The metal electrode 1054 is formed to include a metallic material such as a stainless or aluminum conductor. A material of the metal electrode 1054 is not limited thereto.

The semiconductor layer 1055 is formed by, for example, amorphous silicon (a-Si:H). As the semiconductor layer 1055, for example, a p-n junction type semiconductor in which p-type and n-type semiconductors are joined is used.

The metal electrode 1054 and the semiconductor layer 1055 are formed on the resin substrate 1053 in a stacked manner by a method such as vapor deposition. The method of forming the metal electrode 1054 and the semiconductor layer 1055 on the resin substrate 1053 is not limited thereto.

The transparent electrode 1056 is formed by crystallization of zinc oxide, indium oxide, or tin oxide on a substrate made of glass or the like. The material and method of forming the transparent electrode 1056 are not limited thereto.

In the present embodiment, a portion of the solar panel 105 around the first light receiving regions 10501c, 10501e (excluding the connecting regions 10503c, 10503e) arranged above the radiating electrode 1042 is subjected to removal of a metal electrode 1054, a semiconductor layer 1055, and a transparent electrode 1056, to thereby provide an electrode removed portion 1057 around the first light receiving regions 10501c, 10501e.

The method of removing the metal electrode 1054, the semiconductor layer 1055, and the transparent electrode 1056 is not limited to any particular method, and a laser processing method, for example, may be used.

The electrode removed portion 1057 of the present embodiment is provided to fit an outer shape of the radiating electrode 1042 to have a width of about 1 mm inside and about 2 mm outside of the end portions across the positions corresponding to the end portions of the radiating electrode 1042 (i.e., sides that constitute the outer shape of the radiating electrode 1042).

The width, shape, and the like of the electrode removed portion 1057 are not limited to those illustrated herein, and may be determined as needed.

In terms of maintaining the antenna characteristic of the circular polarization antenna 104, it may be preferable to provide the electrode removed portion 1057 in the entire range considered to affect the spreading of the radiating pattern from the end portions of the radiating electrode 1042. However, an excessively large electrode removed portion 1057 may decrease the light receiving area of the solar panel 105 to impair power generation efficiency. It is preferable, therefore, to provide the electrode removed portion 1057 with the smallest possible width within a range not to impair the antenna characteristic of the circular polarization antenna 104.

In the present embodiment, as illustrated in FIG. 13, a conductive reinforcing material R made of a conductive material having high electric conductivity is provided in the connecting regions 10503 that connect between the first and second light receiving regions 10501 and 10502 of the solar panel 105. The conductive reinforcing material R is electrically connected to the transparent electrodes 1056 of the first and second light receiving regions 10501 and 10502. The conductive reinforcing material R reinforces electric conductivity of the transparent electrodes 1056, and is stacked on the transparent electrodes 1056 in the connecting regions 10503.

The connecting regions 10503 are formed as the constricted portions, as mentioned above, with the width narrower than that of the first and second light receiving regions 10501 and 10502. With the structure similar to that of the first and second light receiving regions 10501 and 10502, therefore, electric resistance values of the transparent electrodes 1056 would be higher than that of the first and second light receiving regions 10501 and 10502. Such locally high electric resistance values may cause a decrease of the power generation capacity of the solar panel 105.

In the present embodiment, therefore, the conductive reinforcing material R is provided on the transparent electrodes 1056 of the connecting regions 10503 to decrease the electric resistance value of the transparent electrodes 1056 of the connecting regions 10503. Accordingly, the current amount of the connecting regions 10503 is not restricted, and the decrease of power generation capacity of the solar panel 105 is suppressed. Unlike the transparent electrodes 1056, the metal electrodes 1054 are made of a material, such as aluminum conductor having high electric conductivity, and there is no high necessity for compensating the electric conductivity thereof.

The conductive reinforcing material R is not specifically limited so long as the material is a conductive material (e.g., silver) having high electric conductivity, but it would be more preferable if the material is transparent (having light transmission characteristic) similar to the transparent electrodes 1056. It would not cause a particular problem, however, if the conductive reinforcing material R is not transparent, because only a small amount of power generation is lost in the connecting regions 10503 as they having small light receiving areas.

In the present embodiment, as illustrated in FIGS. 10 and 11, the seven solar cells 1050*a* to 1050*g* are formed to have areas nearly equal to each other to provide nearly the same output current.

The solar cells 1050*a* to 1050*g* are connected in series to function as one solar panel.

Specifically, the solar cell 1050*a* is electrically connected to the adjacent solar cell 1050*b* at a connecting portion 1052*a*, and the solar cell 1050*b* is electrically connected to the adjacent solar cell 1050*c* at a connecting portion 1052*b*. Similarly, the solar cells 1050*c* to 1050*f* are electrically connected to the adjacent solar cells 1050*d* to 1050*g*, respectively, at connecting portions 1052*c* to 1052*f*.

For example, the connecting portion 1052*g* formed on the side of the solar cell 1050*a* is independent of the connecting portion 1052*g* formed on the side of the solar cell 1050*g*. The connecting portions 1052*g*, 1052*g* are coupled with connectors (connecting members) which are not illustrated. The connectors are then connected to positive and negative electrodes, respectively, on a circuit board (not illustrated) to electrically connect the solar panel 5 to the circuit board. The connecting portions to be connected to the circuit board are not limited to the connecting portions 1052*g*, 1052*g*, and any connecting portions may be used so long as they have such structures.

The positions and shapes of the connecting portions 1052*a* to 1052*g* are not limited to the illustrated examples.

In the present embodiment, a date wheel (not illustrated) is arranged in the module 103, and a date display window 1012 that displays a date is provided on the dial 101.

On the solar panel 105, an opening 10511 for displaying the date is formed at a position corresponding to the date display window 1012 of the dial 101.

In the present embodiment, the opening 10511 for displaying the date is provided in the electrode removed portion 1057 of the solar panel 105 that cannot be used for power generation.

The opening 10511 for displaying the date is provided without affecting the power generation amount of the solar panel 105.

Next, operation of the timepiece 1100 of the present embodiment will be described.

To assemble the timepiece 1100 of the present embodiment, the solar panel 105 constituted by a plurality of solar cells 1050 is formed first. After that, a portion of the solar panel 105 around the first light receiving regions 10501*c*, 10501*e* (excluding the connecting regions 10503*c*, 10503*e*) arranged above the radiating electrode 1042 are subjected to removal of the metal electrode 1054, the semiconductor layer 1055, and the transparent electrode 1056, to thereby provide the electrode removed portion 1057. The conductive reinforcing material R is stacked on the transparent electrodes 1056 of the connecting regions 10503.

The light receiving surfaces of the solar cells 1050*a* to 1050*g* are connected in series with the connecting portions 1052*a* to 1052*g*, respectively. Simultaneously, some of the connecting portions 1052*a* to 1052*g* (e.g., the connecting portion 1052*g* provided on the side of the solar cell 1050*a* and the connecting portion 1052*g* provided on the side of the solar cell 1050*g*) are connected to the connectors (connecting members) which is not illustrated, and these connectors are coupled with the positive and negative electrodes, respectively, on the circuit board which is not illustrated. Accordingly, the solar panel 105 is electrically connected to the circuit board, and the power generated in the solar panel 105 becomes capable of being charged in the secondary battery.

The circular polarization antenna 104 is fitted in the antenna fitting portion 1032 of the module 103, and the solar panel 105 is arranged on the module 103 in such a manner that the first light receiving regions 10501*c*, 10501*e* are arranged above the circular polarization antenna 104. The dial 101 is then stacked on top of the solar panel 105 and stored in the case.

The pointers 102 are mounted on the pointer shaft 1031 that penetrates the solar panel 105 and the dial 101 from the side of the module 103 and sticks out of the top face of the dial 101. After that, a windshield member (not illustrated) made of a transparent glass or the like is mounted on the side of the top face (viewing side) of the case over the dial 101. Thus the assembly of the timepiece 1100 is completed.

In the timepiece 1100 of the present embodiment, light transmits through the windshield member and the dial 101 from the viewing side and is incident on the solar panel 105 including the solar cells 1050*a* to 1050*g*. Then the light passes through the transparent electrode 1056 to enter the semiconductor layer 1055. When the light enters the semiconductor layer 1055, holes and electrons are generated in the vicinity of the junction between the p-type semiconductor and the n-type semiconductor. The generated electrons and holes are moved toward the n-type semiconductor and the p-type semiconductor, respectively, to generate electromotive force (photovoltaic power). As a result, electric current is made to flow through the circuit connected to the transparent electrode 1056 and the metal electrode 1054. At this time, the electric resistance value of the transparent electrode 1056 is suppressed to a low value, as the connecting region 10503 of the solar panel 105 are a constricted portion with a narrow width but is provided with the conductive reinforcing material R in the transparent electrode 1056 thereof. As a result, the current amount is not excessively suppressed in the connecting regions 10503. The power generated by the solar panel 105 is thus charged in the secondary battery.

Meanwhile, in the timepiece 1100, the GPS radio wave having transmitted through the windshield and the dial 101 is incident on the circular polarization antenna 104.

Since the end portions of the radiating electrode 1042 of the circular polarization antenna 104 have not been covered by conductive members (e.g., the metal electrode 1054, the semiconductor layer 1055, and the transparent electrode 1056 of the solar panel 1050), as described above, the spreading of the radiating pattern is not blocked and the circular polarization antenna 104 can properly receive the GPS radio wave.

The GPS radio wave received by the circular polarization antenna 104 is sent to a control circuit (not illustrated) in the module 103. The control circuit uses time information, etc., included in the GPS radio wave to correct internal time of the timepiece 1100 to provide exact time.

According to the present embodiment as described above, the first light receiving regions 10501 are connected to the second light receiving regions 10502 in the solar panel 105. The conductive reinforcing material R is provided in the connecting regions 10503 having the width W narrower than that of the first and second light receiving regions 10501 and 10502, and is electrically connected to the transparent electrodes 1056 of the first and second light receiving regions 10501 and 10502, respectively.

Accordingly, the electric resistance values of the electrodes (transparent electrodes 1056) in the connecting regions 10503 can be suppressed to low values, while the first and second light receiving regions 10501 and 10502 are connected via the connecting regions 10503 and can be effectively made to function as the connected solar cell 1050. Accordingly, the large light receiving portions can be secured in the solar panel 105 without decreasing the power generation capacity of the solar panel 105.

In the present embodiment, the conductive reinforcing material R is stacked on the transparent electrodes 1056 in the connecting regions 10503.

In other words, the large light receiving portions can be secured without decreasing the power generation capacity of the solar panel 5 by a simple structure of stacking the conductive reinforcing material R on the transparent electrodes 1056 of the connecting regions 10503.

In the present embodiment, the first light receiving region 10501 arranged above the radiating electrode 1042 of the circular polarization antenna 104, and second light receiving region 10502 arranged at a position away from the above of the radiating electrode 1042, are connected together via the connecting regions 10503 provided above and across the end portions of the radiating electrode 1042 in the solar panel 105.

Accordingly, the end portions of the radiating electrode 1042 of the circular polarization antenna 104 are covered only slightly by the connecting regions 10503. The antenna characteristics of the circular polarization antenna 104 are not substantially changed, and the GPS radio waves including time information and the like can be properly received.

In the present embodiment, the conductive reinforcing material R is stacked on the transparent electrodes 1056 in the connecting regions 10503, but the conductive reinforcing material R may not be arranged in this manner.

Figure 14:
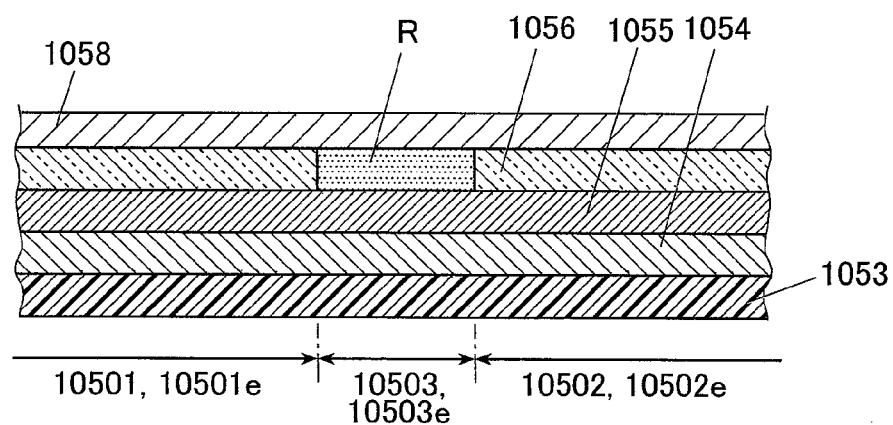
FIG. 14 is a sectional view of a modification of the solar panel in FIG. 12.

For example, as illustrated in FIG. 14, the conductive reinforcing material R may be provided in the connecting region 10503 instead of the transparent electrode 1056. In this case, it is needless to say that the conductive reinforcing material R should be made of a conductive material having higher electric conductivity than the transparent electrode 1056.

Figure 15:
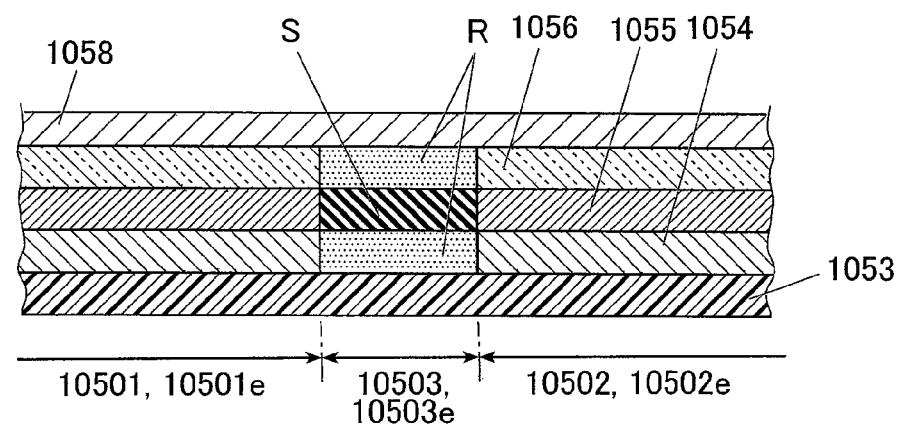
FIG. 15 is a sectional view of a modification of the solar panel in FIG. 12.

Alternatively, as illustrated in FIG. 15, the metal electrode 1054 and the transparent electrode 1056 may be replaced by the conductive reinforcing material R in the connecting region 10503. The conductive reinforcing material R is electrically connected to the metal electrode 1054 or the transparent electrode 1056 of the first and second light receiving regions 10501 and 10502. In this case, it is needless to say that the conductive reinforcing material R should be made of a conductive material having higher electric conductivity than the metal electrode 1054 or the transparent electrode 1056. Different materials may be used for the conductive reinforcing materials R substituting for the metal electrode 1054 and the transparent electrode 1056. The semiconductor layer 1055 may be replaced by an insulating layer S made of other insulating materials so long as the light reception and power generation are not desired in the connecting regions 10503, due to the reason that, for example, the conductive reinforcing material R does not have the light transmission characteristic. Alternatively, the semiconductor layer 1055 may remain unchanged.

With this structure, the electric resistance value can be suppressed also in the metal electrode 1054 in addition to the transparent electrode 1056 in the connecting regions 10503. The metal electrode 1054 has originally been made of a material having high electric conductivity, as mentioned above, and there is no high necessity to compensate the electric conductivity thereof. By keeping the electric resistance to be a low value, however, the connecting regions 10503 made to have a very narrow width W can be handled without a problem.

Sixth Embodiment

Next, a sixth embodiment of the electronic device according to the present invention will be described by referring to FIG. 16. The structure of the solar panel is the main difference between the present embodiment and the fifth embodiment, and only differences from the fifth embodiment will be described below. Similar parts having the same structure as the fifth embodiment are indicated by the same reference signs and the description thereof will not be repeated.

In the present embodiment, the electronic device will be described when it is realized as a timepiece with a liquid crystal screen.

Figure 16:
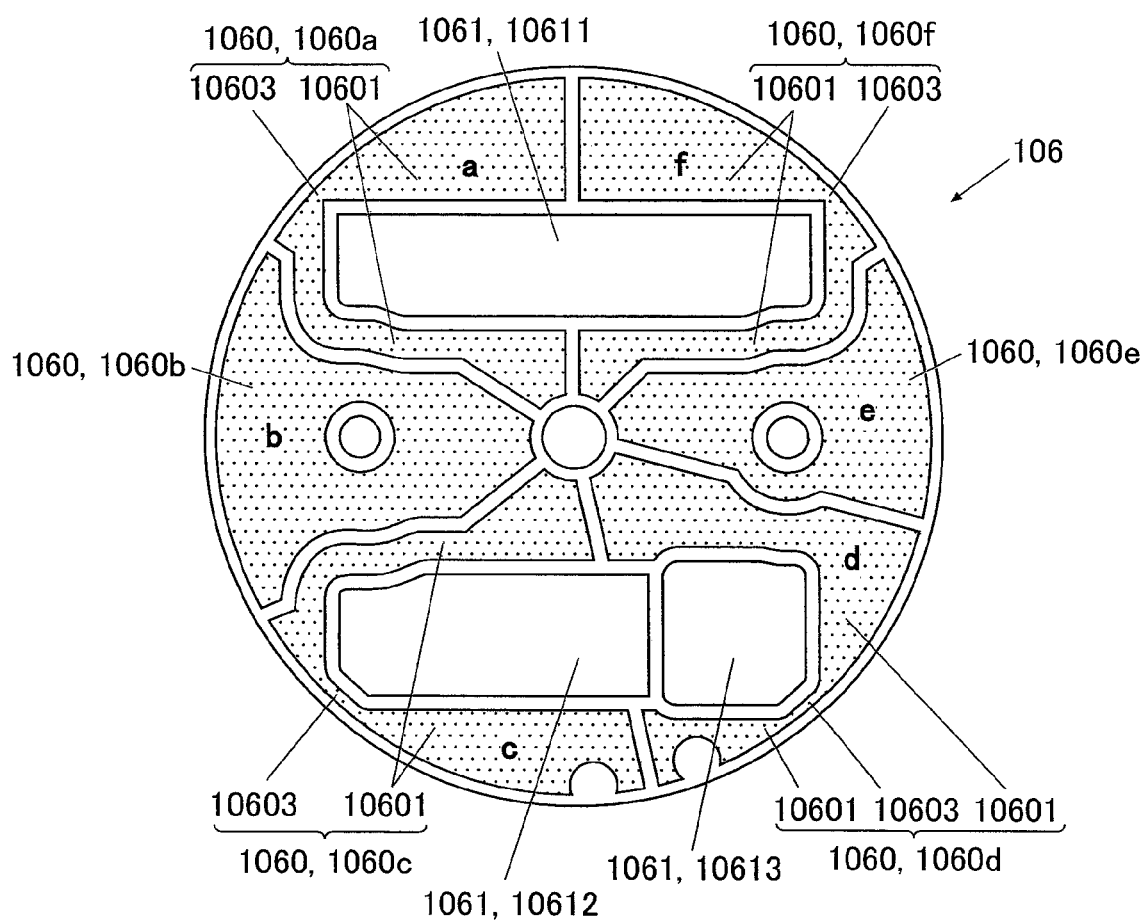
FIG. 16 is a plan view of a solar panel of the sixth embodiment.

FIG. 16 is a plan view of the solar panel of the present embodiment.

As illustrated in FIG. 16, a solar panel 106 of the present embodiment includes a plurality of liquid crystal windows 1061 (liquid crystal windows 10611 to 10613 in the present embodiment) for exposing liquid crystal screens provided in the module.

The solar panel 106 of the present embodiment has a plurality of solar cells 1060 (six solar cells 1060a to 1060f in the present embodiment). The plurality of solar cells 1060 include solar cells 1060 (solar cells 1060a, 1060c, 1060d, and 1060f in the present embodiment) each of which is divided into two light receiving regions by the liquid crystal window 1061 and the peripheral portion of the solar panel 105.

Specifically, each of the solar cells 1060a, 1060c, 1060d, and 1060f includes two light receiving regions 10601 and a connecting region 10603 that connects between the two light receiving regions 10601. The connecting region 10603 includes a constricted portion between the liquid crystal window 1061 and the peripheral portion of the solar panel 105 and has a width narrower than either of the two light receiving regions 10601.

Meanwhile, the solar panel 106 of the present embodiment is formed as a stacked structure, which is not illustrated, as in the solar panel 105 of the fifth embodiment, in which each solar cell 1060 includes a metal electrode, a semiconductor layer, and a transparent electrode.

In the solar panel 106 of the present embodiment, a conductive reinforcing material made of a conductive material having high conductivity is provided in the connecting regions 10603, as in the connecting regions 10503 of the fifth embodiment, that connects two light receiving regions 10601. The conductive reinforcing material is electrically connected to the two light receiving regions 10601. Accordingly, the electric resistance value of the transparent electrodes of the connecting regions 10603 is decreased in order to suppress the decrease of power generation capacity of the solar panel 106.

Other parts of the embodiment are similar to those of the fifth embodiment, and the description thereof will not be repeated.

As described above, the present embodiment can provide the effects similar to those of the fifth embodiment.

Specifically, the conductive reinforcing material R made of a conductive material is provided in the connecting regions 10603 of the solar panel 106 that connect two light receiving regions 10601 and have the width narrower than the two light receiving regions 10601, and the conductive reinforcing material R is electrically connected to the two light receiving regions 10601. Accordingly, the electric resistance values of the electrodes (transparent electrodes) in the connecting regions 10603 can be suppressed to low values, while the two light receiving regions 10601 are connected via the connecting regions 10603 and can be effectively made to function as the connected solar cell 1060. Accordingly, the large light receiving portions can be secured in the solar panel 106 without decreasing the power generation capacity thereof.

The present embodiment can achieve these effects while providing large liquid crystal screen windows 1061 and realizing the timepiece having excellent functionality and visibility.

It is needless to say that the embodiments to which the present invention is applicable are not limited to the fifth and sixth embodiments above, and various modifications can be provided within a range not departing from the scope of the invention.

For example, the dividing method (e.g., number of divisions, shape of each solar cell, etc.) of the solar panel is not limited to the illustrated examples of the above embodiments.

In the solar panel of the embodiments described above, the connecting portions (constricted portions) of the light receiving regions are formed in the case where the end portions of the radiating electrode 1042 of the circular polarization antenna 104 are not covered, or the liquid crystal screen windows 1061 are provided. However, the connecting regions (constricted portions) of the light receiving portions to which the present invention can be applied are not limited to those. The present invention can be applied to a wide variety of solar panels in cases such as a case where a date window is provided, so long as they include the connecting regions (constricted portions) of the light receiving portions of the solar panel.

Further, in each of the above embodiments, the electronic device according to the present invention has been provided as a timepiece, but the electronic device is not limited thereto.

Alternatively, any electronic device may be used so long as it generates power by the solar panel, and uses the generated power as driving source. For example, the electronic device may be realized by such devices as a pedometer, a biological information display device such as a heart rate meter or a pulsometer, and a display device that displays various information including a moving distance, moving pace information, altitude information, or atmospheric pressure information.

Although the embodiments of the present invention have been described above, those are not intended to limit the scope of the present invention which is defined in the appended claims and equivalent range thereof.

What is claimed is:

1. An electronic device, comprising:
a dial;
a module arranged under the dial and including a circular polarization antenna which includes a power feed point and a radiating electrode; and
a solar panel arranged between the dial and the module and having an area corresponding to an area of the dial in a face direction thereof,
wherein the solar panel comprises a plurality of solar cells, and includes an electrode stacked portion including a metal electrode and a transparent electrode and an electrode removed portion which has been subjected to removal of the metal electrode and the transparent electrode;
wherein a solar cell comprising the electrode stacked portion has a light receiving surface arranged at a position corresponding to the radiating electrode among the plurality of solar cells is electrically connected to an adjacent solar cell; and
wherein the electrode removed portion, in which the metal electrode and the transparent electrode are not present, is provided at least at a part of a region of the solar panel which corresponds to an outer portion of a planar shape of the radiating electrode of the circular polarization antenna, such that the outer portion of the radiating electrode does not overlap with the electrode stacked portion.

2. The electronic device according to claim 1, wherein:
a pointer shaft is provided in a center of the module,
a plurality of pointers are connected to the pointer shaft to rotate about the pointer shaft on a top face of the dial, and
the circular polarization antenna is arranged at a position away from the pointer shaft.

3. The electronic device according to claim 2, wherein:
a through hole is provided in the circular polarization antenna, and
the light receiving surface arranged at the position corresponding to the radiating electrode is connected to another light receiving surface via the through hole provided in the circular polarization antenna.

4. The electronic device according to claim 2, wherein the plurality of solar cells are arranged radially about the pointer shaft in such a manner that pointers moving over the plurality of solar cells overlap at least two solar cells.

5. The electronic device according to claim 2, wherein the light receiving surface arranged at the position corresponding to the radiating electrode is connected to another light receiving surface at a connecting position apart from the power feed point.

6. The electronic device according to claim 1, wherein:
a through hole is provided in the circular polarization antenna, and
the light receiving surface arranged at the position corresponding to the radiating electrode is connected to another light receiving surface via the through hole provided in the circular polarization antenna.

7. The electronic device according to claim 6, wherein:
a pointer shaft is provided in a center of the module,
a plurality of pointers are connected to the pointer shaft to rotate about the pointer shaft on a top face of the dial, and the plurality of solar cells are arranged radially about the pointer shaft in such a manner that pointers moving over the plurality of solar cells overlap at least two solar cells.

8. The electronic device according to claim 1, wherein:
a pointer shaft is provided in a center of the module,
a plurality of pointers are connected to the pointer shaft to rotate about the pointer shaft on a top face of the dial, and
the plurality of solar cells are arranged radially about the pointer shaft in such a manner that pointers moving over the plurality of solar cells overlap at least two solar cells.

9. The electronic device according to claim 1, wherein the light receiving surface arranged at the position corresponding to the radiating electrode is connected to another light receiving surface at a connecting position apart from the power feed point.

* * * * *